United States Patent
Kato et al.

(10) Patent No.: US 11,158,385 B2
(45) Date of Patent: Oct. 26, 2021

(54) SEMICONDUCTOR MEMORY DEVICE THAT INCLUDES BLOCK DECODERS EACH HAVING PLURAL TRANSISTORS AND A LATCH CIRCUIT

(71) Applicant: KIOXIA CORPORATION, Tokyo (JP)

(72) Inventors: Koji Kato, Yokohama Kanagawa (JP); Hitoshi Shiga, Kawasaki Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 16/841,377

(22) Filed: Apr. 6, 2020

(65) Prior Publication Data

US 2020/0234774 A1 Jul. 23, 2020

Related U.S. Application Data

(63) Continuation of application No. 16/120,287, filed on Sep. 2, 2018, now Pat. No. 10,629,268.

(30) Foreign Application Priority Data

Oct. 5, 2017 (JP) .............................. JP2017-194985

(51) Int. Cl.
*G11C 16/26* (2006.01)
*H01L 27/1157* (2017.01)
(Continued)

(52) U.S. Cl.
CPC ................ *G11C 16/26* (2013.01); *G11C 8/08* (2013.01); *G11C 8/10* (2013.01); *G11C 16/08* (2013.01);
(Continued)

(58) Field of Classification Search
CPC .............. G11C 29/028; G11C 16/3495; G11C 16/0483; G11C 16/10; G11C 2211/5644;
(Continued)

(56) References Cited

U.S. PATENT DOCUMENTS

| | | | |
|---|---|---|---|
| 7,721,166 | B2 | 5/2010 | Yeh et al. |
| 7,936,004 | B2 | 5/2011 | Kito et al. |

(Continued)

FOREIGN PATENT DOCUMENTS

TW 201007757 A 2/2010

*Primary Examiner* — David Lam
(74) *Attorney, Agent, or Firm* — Kim & Stewart LLP

(57) ABSTRACT

A semiconductor memory device includes a block decoder having a sense node, and a control unit. The block decoder includes first and second transistors each connected between a first node and ground, a third transistor connected between a power source voltage and a second node, a fourth transistor connected between the first and second nodes and controlled by the same gate signal as the third transistor, a fifth transistor having a first terminal connected to the sense node and a gate connected to the second node through an inverter, and a latch circuit that switches the first transistor on and off according to its setting. The control unit determines the setting of the latch circuit, according to a logic level based on a voltage of the sense node during an operation in which the second and third transistors are turned off and the fourth transistor is turned on.

11 Claims, 20 Drawing Sheets

(51) Int. Cl.
*G11C 16/14* (2006.01)
*G11C 16/08* (2006.01)
*G11C 16/24* (2006.01)
*G11C 16/34* (2006.01)
*G11C 8/10* (2006.01)
*G11C 16/10* (2006.01)
*G11C 8/08* (2006.01)
*G11C 16/32* (2006.01)
*H01L 27/11582* (2017.01)
*G11C 16/04* (2006.01)

(52) U.S. Cl.
CPC .............. *G11C 16/10* (2013.01); *G11C 16/14* (2013.01); *G11C 16/24* (2013.01); *G11C 16/32* (2013.01); *G11C 16/3445* (2013.01); *H01L 27/1157* (2013.01); *G11C 16/0483* (2013.01); *H01L 27/11582* (2013.01)

(58) Field of Classification Search
CPC ... G11C 29/021; G11C 29/44; G11C 11/5628; G11C 2029/0409
See application file for complete search history.

(56) References Cited

U.S. PATENT DOCUMENTS

| | | |
|---|---|---|
| 9,455,048 B2 | 9/2016 | Berckmann et al. |
| 9,595,319 B2 | 3/2017 | Lee |
| 9,691,484 B2 * | 6/2017 | Minamoto .......... H01L 27/1157 |
| 2016/0293271 A1 | 10/2016 | Won et al. |

* cited by examiner

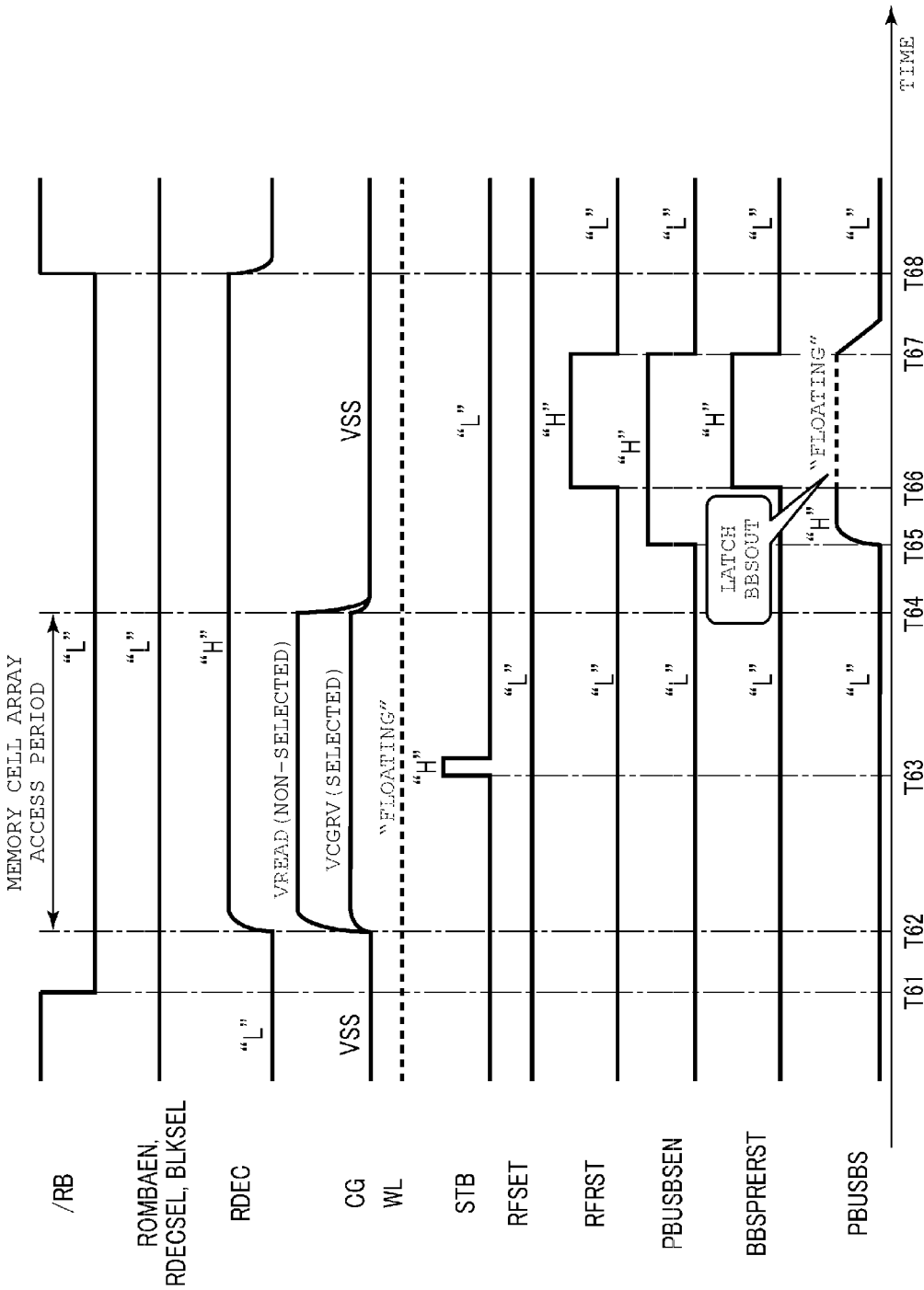

SEMICONDUCTOR MEMORY DEVICE THAT INCLUDES BLOCK DECODERS EACH HAVING PLURAL TRANSISTORS AND A LATCH CIRCUIT

CROSS-REFERENCE TO RELATED APPLICATIONS

This application is a continuation of U.S. patent application Ser. No. 16/120,287, filed Sep. 2, 2018, now U.S. Pat. No. 10,629,268, issued Apr. 21, 2020, which application is based upon and claims the benefit of priority from Japanese Patent Application No. 2017-194985, filed Oct. 5, 2017, the entire contents of which are incorporated herein by reference.

FIELD

Embodiments described herein relate generally to a semiconductor memory device.

BACKGROUND

A NAND flash memory as a semiconductor memory device is known.

DESCRIPTION OF THE DRAWINGS

FIG. 20 is another timing chart for explaining the sensing operation of information set in the bad block latch of the semiconductor memory device according to the third modification example.

DETAILED DESCRIPTION

Figure 1:
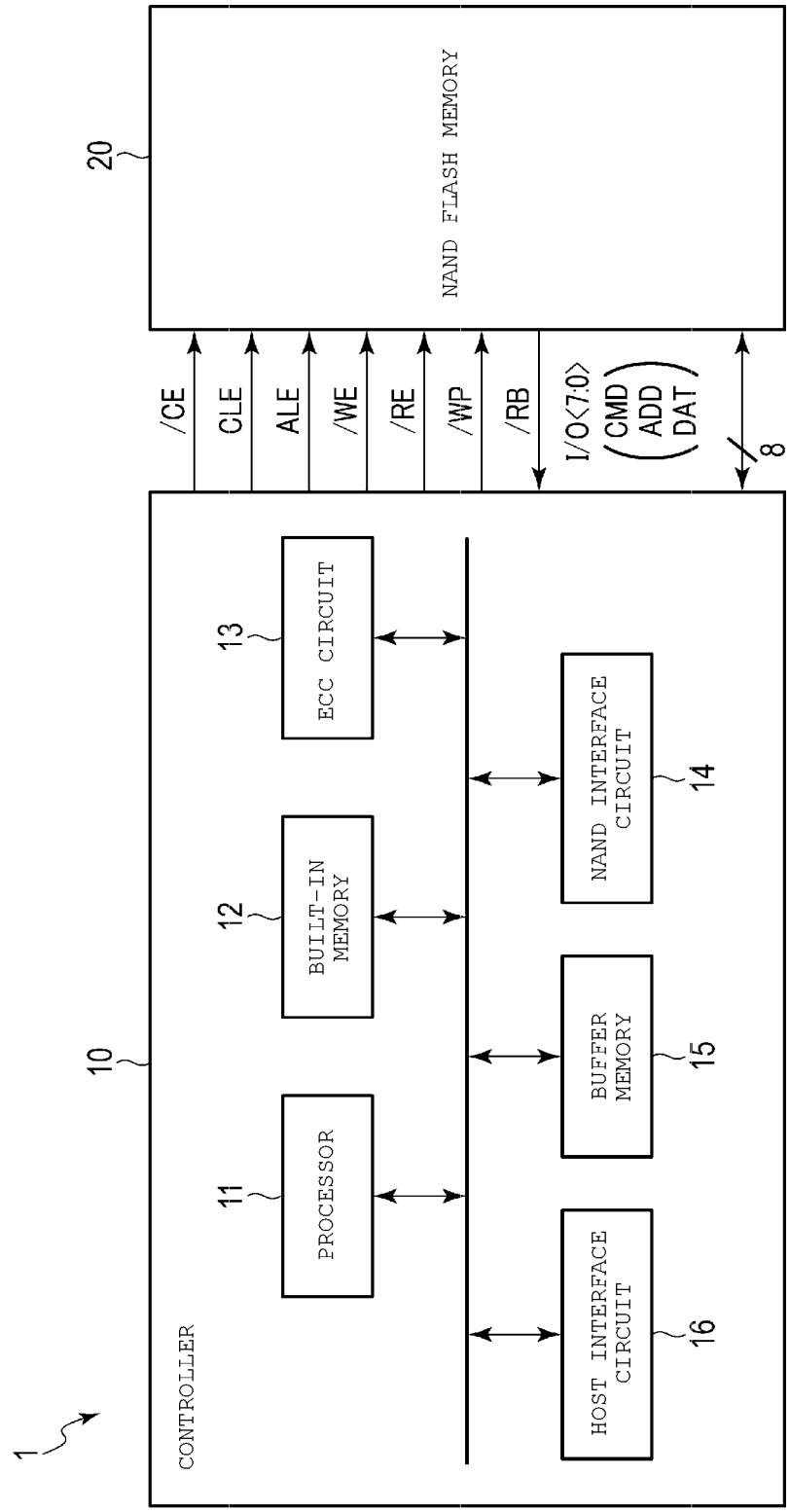
FIG. 1 is a block diagram for explaining a configuration of a memory system according to a first embodiment.

In general, according to one embodiment, a semiconductor memory device includes a block decoder having a sense node, and a control unit. The block decoder includes a first transistor that includes a first terminal electrically connected to a first node and a second terminal to which a first voltage is supplied, a second transistor that includes a first terminal electrically connected to the first node and a second terminal to which a second voltage equal to the first voltage is supplied, a third transistor that includes a first terminal to which a third voltage greater than the first voltage and the second voltage is supplied and a second terminal electrically connected to a second node, a fourth transistor that includes a first terminal electrically connected to the first node and a gate to which the same signal as a signal input to a gate of the third transistor is input, is electrically connectable between the first node and the second node, and has a polarity different from that of the third transistor, a fifth transistor that includes a first terminal electrically connected to the sense node and a gate electrically connected to a third node having a logic level inverted from a logic level of the second node, and a latch circuit that switches the first transistor to an on state or an off state according to whether or not the latch circuit is set. The control unit is configured to determine whether or not the latch circuit is set, according to a logic level based on a voltage of the sense node during an operation in which the second transistor and the third transistor are turned off and the fourth transistor is turned on.

Hereinafter, embodiments will be described with reference to the drawings. In the following description, constitutional elements having the same functions and configurations are denoted by the same reference numerals.

1. First Embodiment

A semiconductor memory device according to a first embodiment will be described. The semiconductor memory device according to the first embodiment includes, for example, a NAND flash memory.

1.1 Configuration

First, a configuration of a semiconductor memory device according to the first embodiment will be described.

1.1.1 Overall Configuration of Memory System

A configuration example of the memory system according to the first embodiment will be described with reference to FIG. 1. FIG. 1 is a block diagram illustrating an example of the configuration of the memory system according to the first embodiment. A memory system 1 communicates with, for example, an external host apparatus (not illustrated). The memory system 1 stores data from a host apparatus (not illustrated) and transmits read data to a host apparatus.

As illustrated in FIG. 1, the memory system 1 includes a controller 10 and a semiconductor memory device (e.g., NAND flash memory) 20. The controller 10 receives an instruction from the host apparatus and controls the semiconductor memory device 20 based on the received instruction. Specifically, the controller 10 writes data instructed to be written from the host apparatus to the semiconductor memory device 20, reads data instructed to be read from the host apparatus from the semiconductor memory device 20, and transmits the data to the host apparatus. The controller 10 is connected to the semiconductor memory device 20 via a NAND bus. The semiconductor memory device 20 includes a plurality of memory cells and stores data in a nonvolatile manner.

The NAND bus transmits and receives signals /CE, CLE, ALE, /WE, /RE, /WP, /RB, and I/O<7:0> according to a NAND interface standard via individual wirings. The signal /CE is a signal for enabling the semiconductor memory device 20. The signal CLE notifies the semiconductor memory device 20 that the signal I/O <7:0> input to the semiconductor memory device 20 includes a command while the signal CLE is at a "H (High)" level. The signal ALE notifies the semiconductor memory device 20 that the signal I/O <7:0> input to the semiconductor memory device 20 includes an address while the signal ALE is at the "H" level. The signal /WE instructs the semiconductor memory device 20 to buffer the signal I/O <7:0> input to the semiconductor memory device 20 while the signal /WE is at a "L (Low)" level. The signal /RE instructs the semiconductor memory device 20 to output the signal I/O <7:0>. The signal /WP instructs the semiconductor memory device 20 to prohibit data writing and erasing. The signal /RB indicates whether the semiconductor memory device 20 is in a ready state (a state at which reception of an instruction from the outside is allowed) or a busy state (a state at which reception of an instruction from the outside is not allowed). The signal I/O <7:0> is, for example, an 8-bit signal. The signal I/O <7:0> contains the data transmitted and received between the semiconductor memory device 20 and the controller 10, and may include a command CMD, an address ADD, and a data DAT. The data DAT includes write data and read data.

1.1.2 Configuration of Controller

Subsequently, a controller of the memory system according to the first embodiment will be described with continued reference to FIG. 1. The controller 10 includes a processor (CPU: Central Processing Unit) 11, a built-in memory (RAM: Random Access Memory) 12, an error check and correction (ECC) circuit 13, a NAND interface circuit 14, a buffer memory 15, and a host interface circuit 16.

The processor 11 controls the overall operation of the controller 10. The processor 11 issues a read instruction based on the NAND interface standard to the semiconductor memory device 20, for example, in response to a data read instruction received from the host apparatus. This operation also applies to a case of writing and erasing of data. The processor 11 has a function of executing various operations on read data from the semiconductor memory device 20.

A built-in memory 12 is, for example, a semiconductor memory such as a dynamic RAM (DRAM) and is used as a work area of the processor 11. The built-in memory 12 stores firmware for managing the semiconductor memory device 20, various management tables, and the like.

An ECC circuit 13 performs error detection and error correction processing. More specifically, when data is written, an ECC code is generated for each set of a certain number of pieces of data based on data received from the host apparatus. When data is read out, ECC decoding is performed based on the ECC code to detect the presence or absence of an error. When an error is detected, a bit position at which the error is detected is specified and the error is corrected.

The NAND interface circuit 14 is connected to the semiconductor memory device 20 via the NAND bus, and is responsible for communication with the semiconductor memory device 20. Under the instruction of the processor 11, the NAND interface circuit 14 transmits the command CMD, the address ADD, and write data to the semiconductor memory device 20. The NAND interface circuit 14 also receives read data from the semiconductor memory device 20.

The buffer memory 15 temporarily stores data and the like received by the controller 10 from the semiconductor memory device 20 and the host apparatus. The buffer memory 15 is also used, for example, as a storage area for temporarily stores read data from the semiconductor memory device 20, an operation result on read data, and the like.

The host interface circuit 16 is connected to the host apparatus and is responsible for the communication with the host apparatus. The host interface circuit 16 transfers, for example, an instruction and data received from the host apparatus to the processor 11 and the buffer memory 15, respectively.

1.1.3 Configuration of Semiconductor Memory Device

Figure 2:
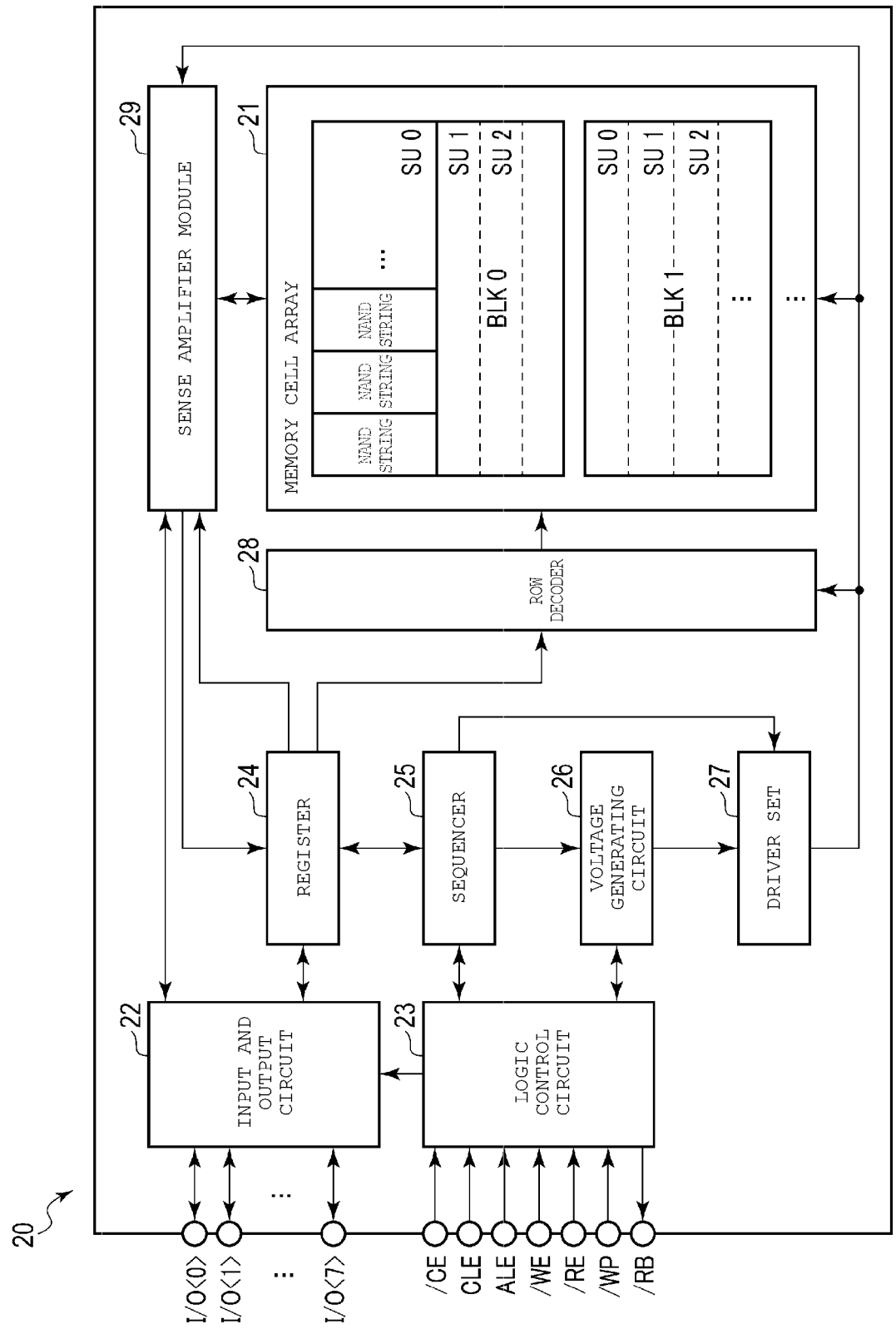
FIG. 2 is a block diagram for explaining a configuration of a semiconductor memory device according to the first embodiment.

Next, a configuration example of the semiconductor memory device according to the first embodiment will be described with reference to FIG. 2. FIG. 2 is a block diagram illustrating an example of the configuration of the semiconductor memory device according to the first embodiment.

The semiconductor memory device 20 includes a memory cell array 21, an input and output circuit 22, a logic control circuit 23, a register 24, a sequencer 25, a voltage generating circuit 26, a driver set 27, a row decoder 28, and a sense amplifier module 29.

The memory cell array 21 includes a plurality of blocks BLK (BLK0, BLK1, . . . ). The block BLK includes a plurality of nonvolatile memory cell transistors (not illustrated) associated with word lines and bit lines. The block BLK is, for example, an erasing unit of data, and data in the same block BLK is collectively erased. Each block BLK includes a plurality of string units SU (SU0, SU1, SU 2, . . . ). Each string unit SU is a set of NAND strings NS. The NAND string NS includes a plurality of memory cell transistors. Hereinafter, the memory cell transistor is simply referred to as a "cell". The number of blocks in the memory cell array 21, the number of string units in one block BLK, and the number of NAND strings in one string unit SU can be set to any number.

The input and output circuit 22 transmits and receives the signal I/O <7:0> to and from the controller 10. The input and output circuit 22 transfers the command CMD and the address ADD in the signal I/O <7:0> to the register 24. The input and output circuit 22 transmits and receives write data and read data to and from the sense amplifier module 29.

The logic control circuit 23 receives the signals /CE, CLE, ALE, /WE, /RE, and /WP from the controller 10. The logic control circuit 23 transfers the signal /RB to the controller 10 and notifies a state of the semiconductor memory device 20 to the outside.

The register 24 stores the command CMD and the address ADD. The register 24 transfers the address ADD to the row decoder 28 and the sense amplifier module 29 and transfers the command CMD to the sequencer 25.

The sequencer 25 receives the command CMD and controls the entire semiconductor memory device 20 according to a sequence based on the received command CMD.

The voltage generating circuit 26 generates a voltage necessary for operations such as writing, reading, and erasing of data based on an instruction from the sequencer 25. The voltage generating circuit 26 supplies the generated voltage to the driver set 27.

The driver set 27 includes a plurality of drivers and supplies various voltages from the voltage generating circuit 26 to the row decoder 28 and the sense amplifier module 29 based on address from the register 24. The driver set 27 supplies various voltages to the row decoder 28, for example, based on a row address in the address.

The row decoder 28 receives the row address in the address ADD from the register 24, and selects the block BLK or the like based on, for example, a block address in the row address. Then, the voltage from the driver set 27 is transferred to the selected block BLK via the row decoder 28.

When data is read, the sense amplifier module 29 senses read data which is read from the memory cell transistor to the bit line, and transfers the sensed read data to the input and output circuit 22. The sense amplifier module 29 transfers write data to be written through the bit lines to the memory cell transistor at the time of writing data. The sense amplifier module 29 receives a column address in the address ADD from the register 24, and outputs column data based on the column address.

1.1.4 Structure of Memory Cell Array

Figure 3:
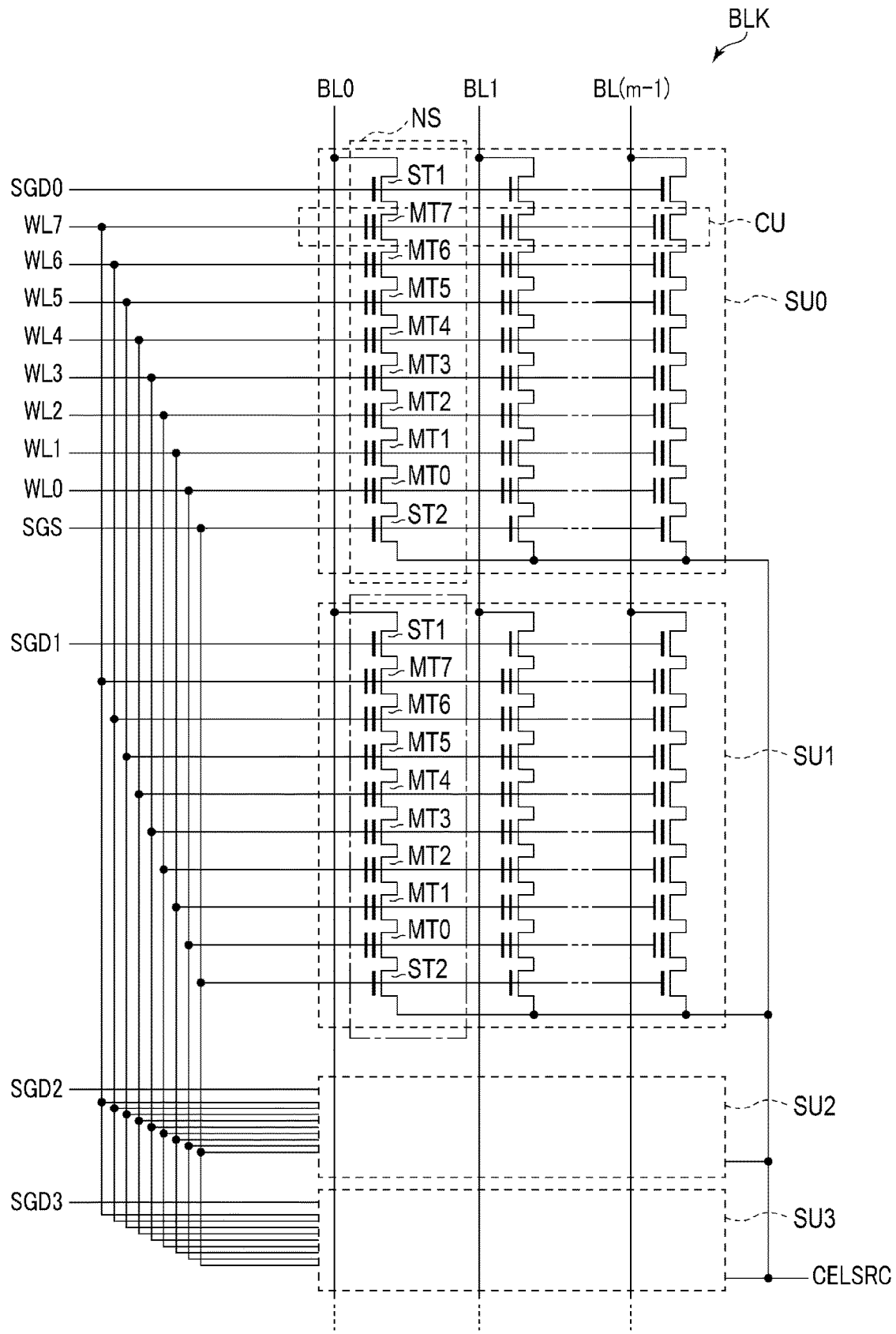
FIG. 3 is a circuit diagram for explaining a configuration of a memory cell array of the semiconductor memory device according to the first embodiment.

Next, the configuration of the memory cell array of the semiconductor memory device according to the first embodiment will be described with reference to FIG. 3. FIG. 3 illustrates an example of a circuit diagram for explaining the configuration of the memory cell array of the semiconductor memory device according to the first embodiment.

As illustrated in FIG. 3, each of the NAND strings NS includes, for example, eight memory cell transistors MT (MT0 to MT7), a select transistor ST1, and a select transistor ST2. The number of the memory cell transistors MT is not limited to eight, and may be 16, 32, 64, 96, 128 or the like, and the number thereof is not limited. The memory cell transistor MT includes a stacked gate including a control gate and a charge storage layer. Each memory cell transistor MT is connected in series between the select transistors ST1 and ST2. In the following description, the term "connection" also includes a case where another electrically conductive element is interposed between elements.

In a certain block BLK, gates of the select transistors ST1 of string units SU0 to SU3 are connected to select gate lines SGD0 to SGD3, respectively. Gates of the select transistors ST2 of all the string units SU in the block BLK are commonly connected to a select gate line SGS. Control gates of the memory cell transistors MT0 to MT7 in the same block BLK are connected to the word lines WL0 to WL7, respectively. That is, the word line WL of the same address is commonly connected to all the string units SU in the same block BLK, and the select gate line SGS is commonly connected to all the string units SU in the same block BLK. On the other hand, a select gate line SGD is connected to only one of the string units SU in the same block BLK.

Among the NAND strings NS arranged in a matrix in the memory cell array 21, the other end of the select transistor ST1 of the NAND string NS in the same row is connected to one of m bit lines BL (BL0 to BL(m−1) (m is a natural number)). The bit line BL is commonly connected to the NAND string NS of the same column across the plurality of blocks BLK.

The other end of the select transistor ST2 is connected to a source line CELSRC. The source line CELSRC is commonly connected to the plurality of NAND strings NS across the plurality of blocks BLK.

As described above, data erasing is performed collectively with respect to the memory cell transistors MT in the same block BLK, for example. In contrast, reading and writing of data are performed collectively with respect to the plurality of memory cell transistors MT commonly connected to any of the word lines WL, in any of the string units SU of any block BLK. Such a set of memory cell transistors MT sharing the word line WL in one string unit SU is referred to as a cell unit CU, for example. That is, the cell unit CU is a set of the memory cell transistors MT for which write operations or read operations can be collectively performed.

One memory cell transistor MT can store a plurality of pieces of bit data, for example. In the same cell unit CU, a set of one bit held at the same bit position by each memory cell transistor MT is called a "page". That is, the "page" can also be defined as a portion of memory space formed in a set of the memory cell transistors MT in the same cell unit CU.

Figure 4:
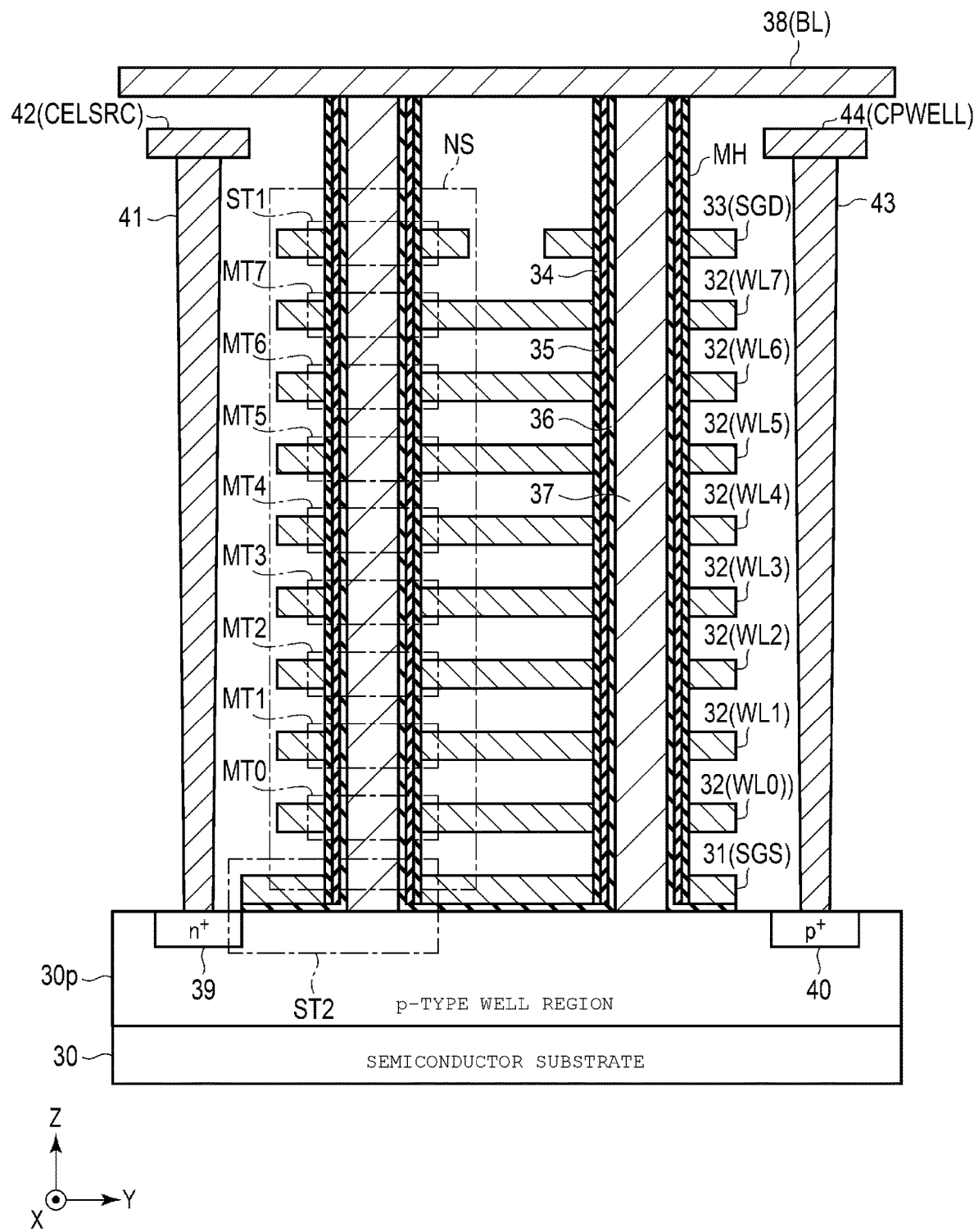
FIG. 4 is a cross-sectional view for explaining the configuration of the memory cell array of the semiconductor memory device according to the first embodiment.

Next, a structure of a cross-section of the memory cell array 21 will be described with reference to FIG. 4. FIG. 4 illustrates an example of a structure of a cross-section of a portion of the memory cell array of the semiconductor memory device according to the first embodiment. In particular, FIG. 4 illustrates the portions relating to two string units SU0 and SU1 in one block BLK. Specifically, FIG. 4 illustrates two NAND strings NS of each of the two string units SU0 and SU1, and peripheral portions thereof. A plurality of configurations of the NAND string NS illustrated in FIG. 4 are arranged in the X-direction and the Y-direction. For example, a set of a plurality of NAND strings NS aligned in the X-direction corresponds to one string unit SU.

The semiconductor memory device 20 is provided on a semiconductor substrate 30. In the following description, a plane parallel to the surface of the semiconductor substrate 30 is defined as an XY plane, and a direction perpendicular to the XY plane is defined as a Z-direction. Further, the X-direction and the Y-direction are assumed to be orthogonal to each other.

A p-type well region 30p is provided above the semiconductor substrate 30. A plurality of NAND strings NS are provided on the p-type well region 30p. That is, on the p-type well region 30p, for example, a wiring layer 31 functioning as the select gate line SGS, eight wiring layers 32 (WL0 to WL7) functioning as word lines WL0 to WL7, and a wiring layer 33 functioning as the select gate line SGD are sequentially stacked. The plurality of wiring layers 31 and 33 may be stacked. An insulating film (not illustrated) is provided between the stacked wiring layers 31 to 33.

The wiring layer 31 is commonly connected to the gates of the respective select transistors ST2 of the plurality of NAND strings NS in one block BLK, for example. The wiring layer 32 is commonly connected to control gates of the respective memory cell transistors MT of the plurality of NAND strings NS in one block BLK, for each layer. The wiring layer 33 is commonly connected to the gates of the respective select transistors ST1 of the plurality of NAND strings NS in one string unit SU.

A memory hole MH is provided so as to pass through the wiring layers 33, 32, and 31 and reach the p-type well region 30$p$. On the side surface of the memory hole MH, a block insulating film 34, a charge storage layer (which is, e.g., an insulating film) 35, and a tunnel oxide film 36 are provided in this order. A semiconductor pillar 37 is buried in the memory hole MH. The semiconductor pillar 37 is, for example, non-doped polysilicon and functions as a current path for the NAND string NS. On the upper end of the semiconductor pillar 37, a wiring layer 38 functioning as the bit line BL is provided.

As described above, the select transistor ST2, the plurality of memory cell transistors MT, and the select transistor ST1 are sequentially stacked above the p-type well region 30$p$, and one memory hole MH corresponds to one NAND string NS.

An $n^+$-type impurity diffusion region 39 and a $p^+$-type impurity diffusion area 40 are provided above the p-type well region 30$p$. A contact plug 41 is provided on the upper surface of the $n^+$-type impurity diffusion region 39. On the upper surface of the contact plug 41, a wiring layer 42 functioning as a source line CELSRC is provided. A contact plug 43 is provided on the upper surface of the $p^+$-type impurity diffusion area 40. On the upper surface of the contact plug 43, a wiring layer 44 functioning as a well line CPWELL is provided.

Regarding the configuration of the memory cell array 21, other configurations may be available, such as the configuration of the memory cell array 21 described in U.S. patent application Ser. No. 12/407,403, filed on Mar. 19, 2009, entitled "Three-dimensional Laminated Nonvolatile Semiconductor Memory," U.S. patent application Ser. No. 12/406,524, filed Mar. 18, 2009, entitled "THREE-DIMENSIONAL LAMINATED NONVOLATILE SEMICONDUCTOR MEMORY," U.S. patent application Ser. No. 12/679,991, filed Mar. 25, 2010, entitled "NONVOLATILE SEMICONDUCTOR MEMORY DEVICE AND MANUFACTURING METHOD THEREOF," and U.S. patent application Ser. No. 12/532,030, filed Mar. 23, 2009, entitled "SEMICONDUCTOR MEMORY AND METHOD OF MANUFACTURING THE SAME." These patent applications are incorporated herein by reference in their entirety.

1.1.4 Configuration of Sense Amplifier Module

Next, a configuration of a sense amplifier module of the semiconductor memory device according to the first embodiment will be described with reference to FIG. 5.

Figure 5:
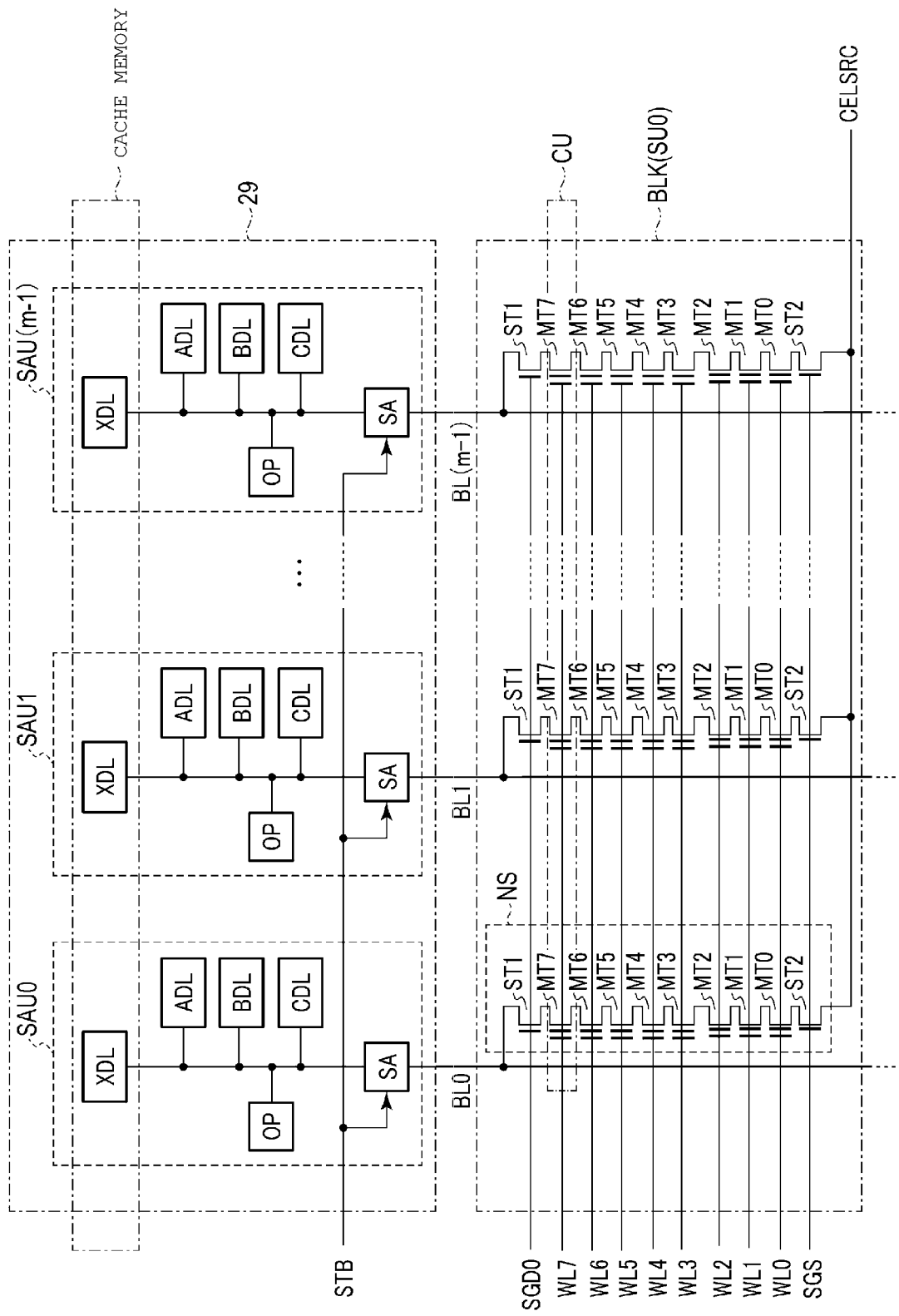
FIG. 5 is a block diagram for explaining a configuration of a sense amplifier module of the semiconductor memory device according to the first embodiment.

As illustrated in FIG. 5, the sense amplifier module 29 includes m sense units SAU (SAU0 to SAU(m−1)), one provided for each bit line BL.

Each of the sense units SAU includes, for example, a sense amplifier SA, an operation unit OP, and latch circuits ADL, BDL, CDL, and XDL.

The sense amplifier SA senses data read to the corresponding bit line BL and applies a voltage to the bit line BL according to write data. That is, the sense amplifier SA is a circuit for directly controlling the bit line BL. A strobe signal STB is issued to the sense amplifier SA by the sequencer 25, for example, at the time of reading. The sense amplifier SA includes a sense node (not illustrated) and a latch circuit (not illustrated) for latching data therein. A potential of the sense node of data fluctuates depending on whether the memory cell transistor MT to be read connected to the word line WL is turned ON or turned OFF. Then, depending on the potential of the sense node of data at the timing when the signal STB is asserted, it is determined whether the memory cell transistor MT is turned ON or OFF, and the result is held in an internal latch circuit by being set to "0" or "1" data. Then, the data held in the internal latch circuit is further transferred to any of the latch circuits ADL, BDL, CDL, and XDL.

The latch circuits ADL, BDL, and CDL temporarily store read data and write data. The operation unit OP performs various logical operations such as a negative (NOT) operation, a logical sum (OR) operation, a logical product (AND) operation, an exclusive logical sum (XOR) operation, and an exclusive not-logical sum (XNOR) operation with respect to data stored in the sense amplifier SA and the latch circuits ADL, BDL, and CDL. For example, the operation unit OP generates page data by performing operations on data transferred from the latch circuit inside a sense amplifier.

The sense amplifiers SA, the latch circuits ADL, BDL, and CDL, and the operation unit OP are connected via a bus so as to be able to transmit and receive data to and from each other. The bus is further connected to a latch circuit XDL.

Data input and output in the sense amplifier module 29 is performed via the latch circuit XDL. That is, data received from the controller 10 is transferred to the latch circuits ADL, BDL, and CDL, or the sense amplifier SA via the latch circuit XDL. The data of the latch circuits ADL, BDL, and CDL or the sense amplifier SA is transmitted to the controller 10 via the latch circuit XDL. The latch circuit XDL functions as a cache memory of the semiconductor memory device 20. Accordingly, even if the latch circuits ADL, BDL, and CDL are in use, if the latch circuit XDL is not used, the semiconductor memory device 20 can be in a ready state.

1.1.5 Configuration of Row Decoder

Next, a configuration of the row decoder of the semiconductor memory device according to the first embodiment will be described with reference to FIG. 6.

Figure 6:
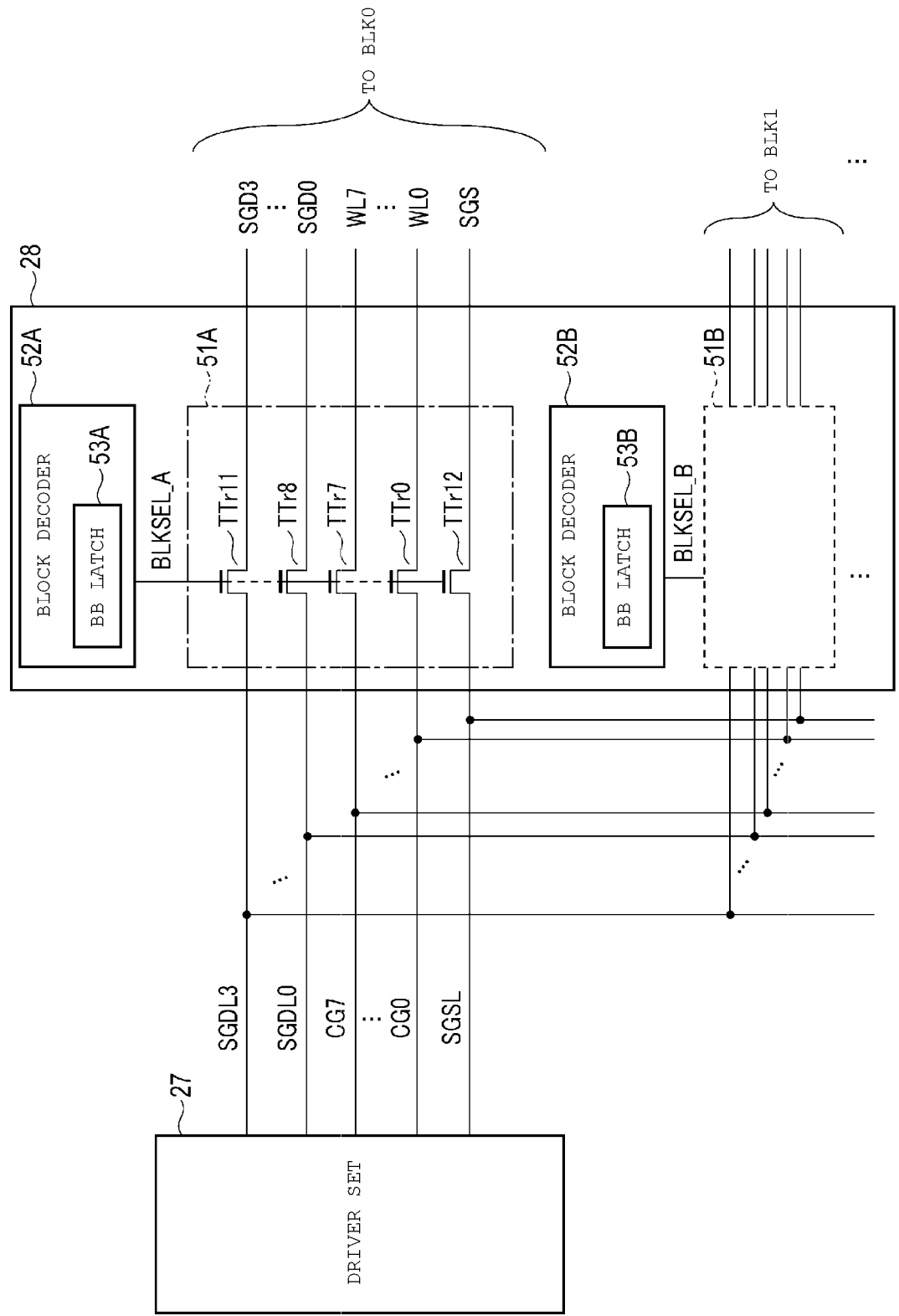
FIG. 6 is a block diagram for explaining a configuration of a row decoder of the semiconductor memory device according to the first embodiment.

As illustrated in FIG. 6, the row decoder 28 includes a plurality of transfer switch groups 51 (51A, 51B, . . . ) and a plurality of block decoders 52 (52A, 52B, . . . ).

One transfer switch group 51 and one block decoder 52 are allocated, for example, to one block BLK. In the example of FIG. 6, a transfer switch group 51A and a block decoder 52A are allocated to a block BLK0, and a transfer switch group 51B and a block decoder 52B are allocated to a block BLK1. In the following description, the block BLK to be written, read, and erased is referred to as a "selected block BLK", and a block BLK other than the selected block BLK is referred to as an "non-selected block BLK".

In the following description, in a case where a node corresponding to the transfer switch group 51A and the block decoder 52A and a node corresponding to the transfer switch group 51B and the block decoder 52B are distinguished, "_A", "_B", and the like are added to the end of the reference numeral to distinguish the transfer switch groups and the block decoders. For example, a node BLKSEL connecting the transfer switch group 51A and the block decoder 52A is referred to as a node BLKSEL_A, and a node BLKSEL connecting the transfer switch group 51B and the block decoder 52B is called a node BLKSEL_B. In a case where the node corresponding to the transfer switch group 51A and the block decoder 52A and the node corresponding to the transfer switch group 51B and the block decoder 52B are not particularly distinguished, "_A", "_B", and the like are not added to the end of the reference numeral.

The transfer switch group 51 includes, for example, thirteen transfer transistors TTr (TTr0 to TT12).

The transfer transistors TTr0 to TTr7 respectively transfer the voltages, which are supplied from the driver set 27 to the wirings CG (CG0 to CG7), to the word lines WL0, to WL7 of the selected block BLK. The transfer transistors TTr0 to TTr7 respectively include a first terminal connected to the word lines WL0 to WL7 of the corresponding block BLK, a second terminal connected to the wirings CG0 to CG7, and a gate commonly connected to a node BLKSEL.

The transfer transistors TTr8 to TTr11 respectively transfer the voltages, which are supplied from the driver set 27 to the wirings SGDL (SGDL0 to SGDL3), to the select gate lines SGD0 to SGD3 of the selected block BLK. The transfer transistors TTr8 to TTr11 respectively include a first terminal connected to the select gate lines SGD0 to SGD3 of the corresponding block BLK, a second terminal connected to the wirings SGDL0 to SGDL3, and a gate commonly connected to the node BLKSEL.

The transfer transistor TTr12 transfers the voltage, which is supplied from the driver set 27 to the wiring SGSL, to the select gate line SGS of the selected block BLK. The transfer transistor TTr12 includes a first terminal connected to the select gate line SGS of corresponding block BLK, a second terminal connected to the wiring SGSL, and a gate connected to the node BLKSEL.

The block decoder 52 decodes a block address signal received from the register 24 at the time of writing, reading, and erasing data. In a case where it is determined that a block BLK corresponding to the block decoder 52 is the selected block BLK, as a result of the decoding, the block decoder 52 outputs a signal of "H" level to the node BLKSEL. In a case where it is determined that the corresponding block BLK is not the selected block BLK, the block decoder 52 outputs a signal of "L" level to the node BLKSEL. The signal output to the node BLKSEL turns ON the transfer transistors TTr0 to TTr12 at the "H" level and turns OFF the transfer transistors TTr0 to TTr12 at the "L" level.

The block decoder 52 includes a bad block latch (BB latch) 53. More specifically, the block decoder 52A includes a bad block latch 53A, and the block decoder 52B includes a bad block latch 53B. The bad block latch 53 includes a latch circuit capable of storing information indicating whether or not an abnormality such as a leak occurs in the corresponding block BLK. For example, in a case where an abnormality occurs in the selected block BLK (such that it is a bad block), the block decoder 52 can set the signal output to the node BLKSEL to the "L" level based on the information held in the bad block latch 53.

Accordingly, for example, in the transfer switch group 51 corresponding to the selected block BLK, in a case where the selected block BLK is normal (not a bad block), the transfer transistors TTr0 to TTr12 can be turned ON. With this, the word lines WL0 to WL7 are respectively connected to the wirings CG0 to CG7, the select gate lines SGD0 to SGD3 are respectively connected to the wirings SGDL0 to SGDL3, and the select gate line SGS is connected to the wiring SGSL.

On the other hand, in the transfer switch group 51 corresponding to the selected block BLK, in a case where the selected block BLK is a bad block, the transfer transistors TTr0 to TTr12 can be turned OFF. With this, the word line WL is electrically disconnected from a wiring CG, and the select gate lines SGD and SGS are electrically disconnected from the wirings SGDL and SGSL, respectively.

In the transfer switch group 51 corresponding to the non-selected block BLK, the transfer transistors TTr0 to TTr12 can be in the OFF state irrespective of whether or not the non-selected block BLK is a bad block. With this, the word line WL is electrically disconnected from the wiring CG, and the select gate lines SGD and SGS are electrically disconnected from the wirings SGDL and SGSL, respectively.

The driver set 27 supplies voltages to the wirings CG, SGDL, and SGSL according to the address ADD received from the register 24. The wirings CG, SGDL and SGSL transfer various voltages supplied from the driver set 27 to each of the transfer switch groups 51A, 51B, . . . . That is, the voltage supplied from the driver set 27 is transferred to the word line WL, and the select gate lines SGD and SGS in the selected block BLK, via the transfer transistors TTr0 to TTr12 in the transfer switch group 51 corresponding to the selected block BLK.

1.1.6 Configuration of Block Decoder

Figure 7:
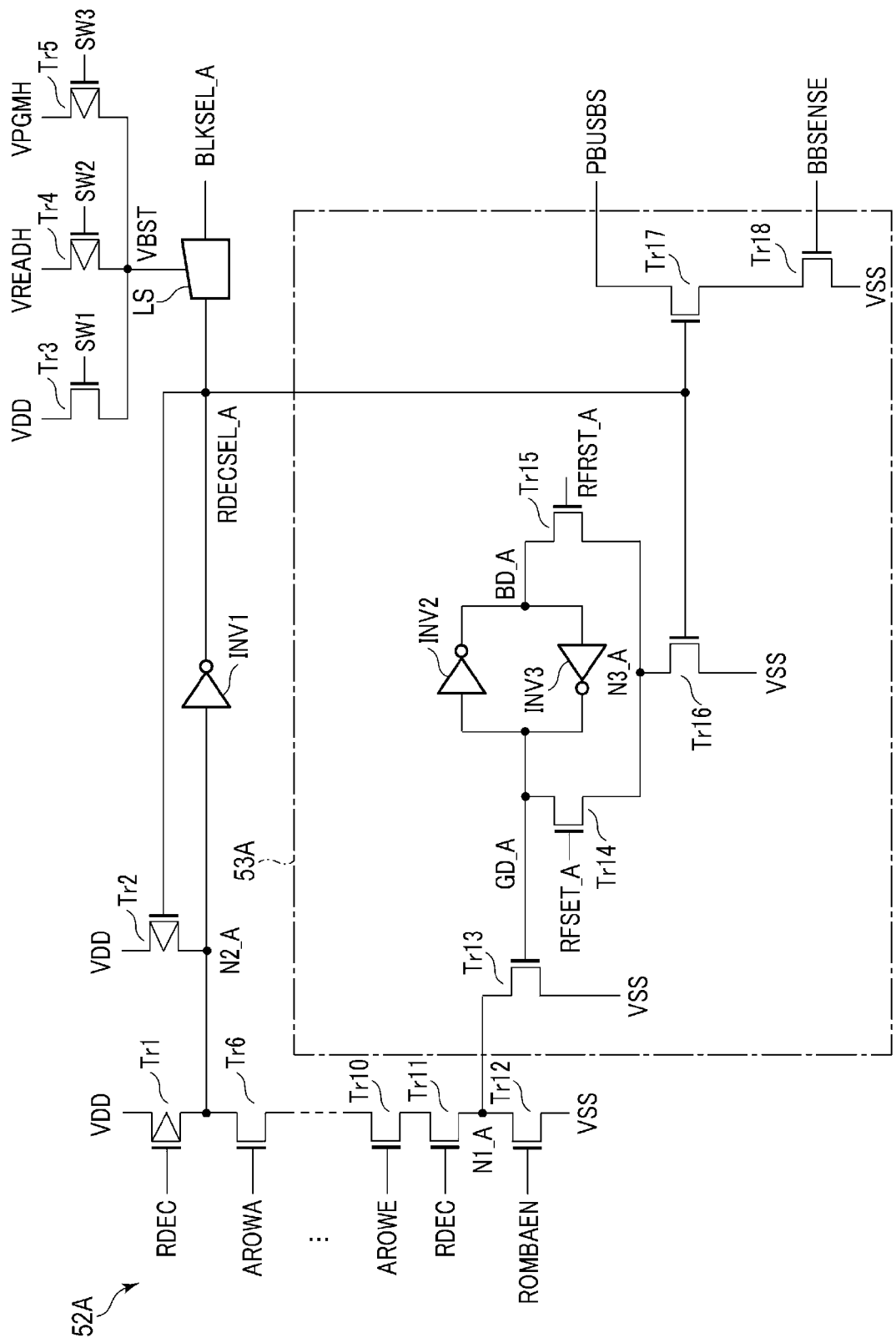
FIG. 7 is a circuit diagram for explaining a configuration of a block decoder of the semiconductor memory device according to the first embodiment.

Next, a configuration of a block decoder of the semiconductor memory device according to the first embodiment will be described with reference to FIG. 7. In FIG. 7, as an example of a block decoder 52, a configuration of the block decoder 52A corresponding to the block BLK0 is illustrated.

As illustrated in FIG. 7, the block decoder 52A includes 18 transistors Tr (Tr1 to Tr18), three inverters INV (INV1 to INV3), and a level shifter LS. In the example of FIG. 7, the transistors Tr1, Tr2, Tr4, and Tr5 have p-type polarities, and the transistors Tr3 and Tr6 to Tr18 have n-type polarities.

The transistor Tr1 includes a first terminal to which a voltage VDD is supplied, a second terminal connected to a node N2_A, and a gate connected to a node RDEC. The voltage VDD is, for example, a power supply voltage, and is a voltage capable of turning ON each transistor Tr in the block decoder 52. The node RDEC is a node to which an enable signal for block address decoding is input. For example, the node RDEC is set to the "L" level when the block decoder 52A is disabled, and is set to the "H" level when the block decoder 52A is enabled.

The transistor Tr2 includes a first terminal to which the voltage VDD is supplied, a second terminal connected to a node N2_A, and a gate connected to a node RDECSEL_A.

The inverter INV1 includes an input terminal connected to the node N2_A and an output terminal connected to the node RDECSEL_A. That is, the nodes N2_A and RDECSEL_A have signals of logic levels inverted from each other. For example, the node RDECSEL_A may be in the "H" level in a case where the block BLK0 is the selected block BLK, and may be at the "L" level when the block BLK0 is the non-selected block BLK.

A level shifter LS includes an input terminal connected to the node RDECSEL_A and an output terminal connected to the node BLKSEL_A, and a voltage is supplied from a node VBST. In a case where the node RDECSEL_A is at the "H" level, the level shifter LS outputs a boosted voltage to the node BLKSEL_A based on the voltage of the node VBST.

For example, voltages VDD, VREADH, VPGMH, and the like can be supplied to the node VBST via the transistors Tr3 to Tr5, respectively.

More specifically, the transistor Tr3 includes a first terminal to which the voltage VDD is supplied, a second terminal electrically connected to the node VBST, a gate electrically connected to the node SW1. For example, voltage VSS or VDDH is supplied to a node SW1. The transistor Tr3 transfers the voltage VDD to the node VBST in a case where the voltage VDDH is supplied to the node SW1. In a case where the voltage VSS is supplied to the node SW1, the transistor Tr3 is turned OFF and supplying of the voltage VDD to the node VBST is stopped.

The voltage VSS is, for example, a ground voltage smaller than the voltage VDD, and is a voltage at which each transistor Tr in the block decoder 52 can be turned OFF. The voltage VDD is a voltage at which the transfer transistors TTr0 to TTr7 can be turned ON to such an extent that the voltage VSS can be transferred to the word line WL. The voltage VDD is a voltage at which the transfer transistors TTr0 to TTr7 can be turned ON to such an extent that the voltage of the word line WL can be discharged to the wiring CG.

The transistor Tr4 includes a first terminal to which a voltage VREADH is supplied, a second terminal electrically connected to the node VBST, and a gate electrically connected to a node SW2. For example, the voltage VSS or VREADH is supplied to the node SW2. The transistor Tr4 transfers the voltage VREADH to the node VBST in a case where the voltage VSS is supplied to the node SW2. In a case where the voltage VREADH is supplied to the node SW2, the transistor Tr4 is turned OFF, and stops supplying of the voltage VREADH to the node VBST.

A voltage VREADH is a voltage at which the transfer transistors TTr0 to TTr7 can be turned ON to the extent that the voltage VREAD can be transferred to the word line WL. The voltage VREAD is a voltage to be applied to the word line WL connected to the memory cell transistor MT not to be read in the read operation and is a voltage for turning ON the memory cell transistor MT irrespective of data stored therein.

The transistor Tr5 includes a first terminal to which a voltage VPGMH is supplied, a second terminal electrically connected to the node VBST, and a gate electrically connected to a node SW3. For example, the voltage VSS or VPGMH is supplied to the node SW3. The transistor Tr5 transfers the voltage VPGMH to the node VBST in a case where the voltage VSS is supplied to the node SW3. In a case where the voltage VPGMH is supplied to the node SW3, the transistor Tr5 is turned OFF, and stops supplying of the voltage VPGMH to the node VBST.

The voltage VPGMH is a voltage at which the transfer transistors TTr0 to TTr7 can be turned ON to such an extent that the voltage VPGM can be transferred to the word line WL. The voltage VPGM is a voltage for injecting electrons into the charge storage layer 35 of the memory cell transistor MT.

As such, a plurality of kinds of voltages of "H" level are supplied to the level shifter LS via the node VEST by switching ON and OFF states of the transistors Tr3 to Tr5. That is, the level shifter LS can output the voltage VDD when only the transistor Tr3 is in the ON state, the voltage VREADH when only the transistor Tr4 is in the ON state, and the voltage VPGMH when only the transistor Tr5 is in the ON state, among the transistors Tr3 to Tr5, respectively.

The transistors Tr6 to Tr10 are connected in series between the node N2_A and the first terminal of the transistor Tr11. More specifically, the first terminal of the transistor Tr6 is connected to the node N2_A, and the second terminal of the transistor Tr10 is connected to the first terminal of the transistor Tr11. The transistors Tr6 to Tr10 receive the signals AROWA to AROWE at the gates, respectively. The signals AROWA to AROWE are signals generated based on the block address signal, and in a case where the block BLK0 is the selected block BLK, the signals AROWA to AROWE turn ON the transistors Tr6 to Tr10, respectively.

The transistor Tr11 includes a second terminal connected to the node N1_A and a gate connected to the node RDEC.

The transistor Tr12 includes a first terminal connected to the node N1_A, a second terminal to which the voltage VSS is supplied, and a gate to which a node ROMBAEN is connected. The node ROMBAEN can set the node RDECSEL_A to the "H" level irrespective of control related to the bad block which will be described later. Specifically, for example, when the "H" level is set to the node ROMBAEN, such that the transistor Tr12 is turned ON, the "L" level is supplied to the node N2_A via the node N1_A irrespective of whether the transistor Tr13 is turned ON or OFF, and the node RDECSEL_A can be set to the "H" level.

The transistors Tr13 to Tr18 and the inverters INV2 and INV3 are provided in a bad block latch 53A.

The transistor Tr13 includes a first terminal connected to the node N1_A, a second terminal to which the voltage VSS is supplied, and a gate connected to the node GD_A.

The inverters INV2 and INV3 are cross-connected to form a latch circuit. Specifically, the inverter INV2 includes an input terminal connected to a node GD_A and an output terminal connected to a node BD_A. The inverter INV3 includes an input terminal connected to the node BD_A and an output terminal connected to the node GD_A. The nodes GD_A and BD_A have logic levels inverted to each other. More specifically, it indicates that in a case where the nodes GD_A and BD_A are at the "H" level and the "L" level, respectively, the block BLK0 is not a bad block and in a case where the nodes GD_A and BD_A are the "L" level and the "H" level, respectively, the block BLK0 is a bad block.

The transistor Tr14 includes a first terminal connected to the node GD_A, a second terminal connected to a node N3_A, and a gate connected to a node RFSET_A. To the node RFSET_A, a signal for setting information indicating that the block BLK0 is a bad block in the bad block latch 53A is transferred. Specifically, in a case where the node RFSET_A is at "H" level, the "L" level is transferred to the node GD_A, and information indicating that the block BLK0 is a bad block is set in the bad block latch 53A.

The transistor Tr15 includes a first terminal connected to the node BD_A, a second terminal connected to the node N3_A, and a gate connected to a node RFRST_A. To the node RFRST_A, a signal for resetting information indicating that the block BLK0 is a bad block in the bad block latch 53A is transferred. Specifically, when the node RFRST_A is at the "H" level, the "L" level is transferred to the node BD_A, and information indicating that the block BLK0 is not a bad block is reset from the bad block latch 53A.

The transistor Tr16 includes a first terminal connected to the node N3_A, a second terminal to which the voltage VSS is supplied, and a gate connected to the node RDECSEL_A.

The transistor Tr17 includes a first terminal connected to a node PBUSBS, a second terminal connected to a first terminal of the transistor Tr18, and a gate connected to the node RDECSEL_A. The node PBUSBS is a node (sense node of the bad block latch 53) to which a signal for sensing information stored in all the bad block latches 53 including the bad block latch 53A is transferred. For example, the node PBUSBS enters a floating state of "H" level in a case where the block BLK corresponding to the bad block latch 53 to be sensed is a bad block, and goes to the "L" level in a case where the block BLK is not a bad block.

The transistor Tr18 includes a second terminal to which the voltage VSS is supplied and a gate connected to a node BBSENSE. The node BBSENSE is a node to which an enable signal of a sensing operation of all the bad block latches 53 including the bad block latch 53A is input. For example, the node BBSENSE is set to the "L" level when disabling the sensing operation for any one of the bad block latches 53, and is set to the "H" level when enabling the sensing operation.

1.1.7 Configuration of Sense Node of Bad Block Latch

Figure 8:
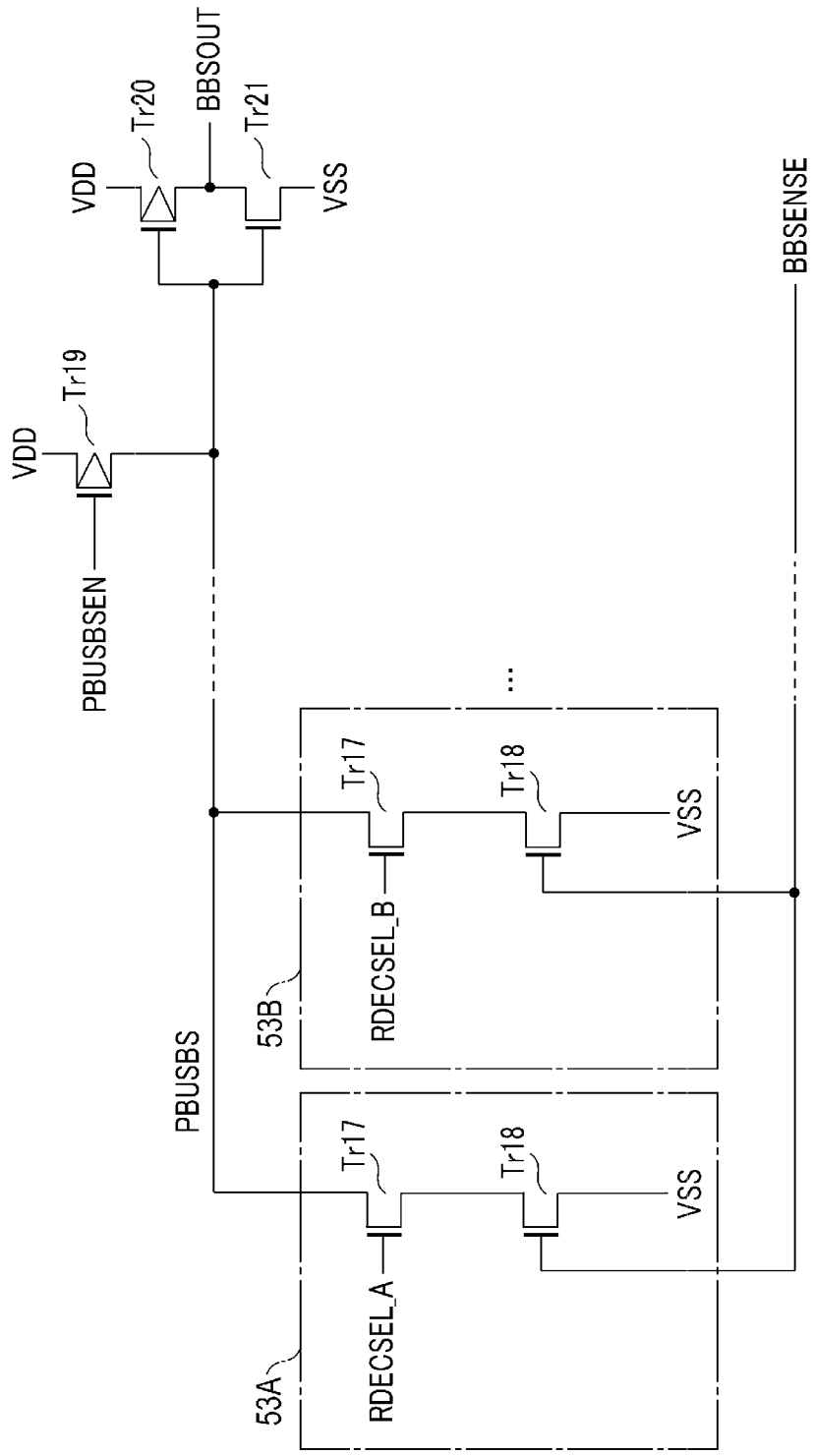
FIG. 8 is a circuit diagram for explaining a configuration of a sense node of a bad block latch of the semiconductor memory device according to the first embodiment.

Next, a configuration of a sense node of a bad block latch of the semiconductor memory device according to the first embodiment will be described with reference to FIG. 8. In FIG. 8, a connection relationship between a plurality of bad block latches 53 (53A, 53B, . . . ) and the nodes BBSENSE and PBUSBS are illustrated.

As illustrated in FIG. 8, the node BBSENSE is commonly connected to the gates of the transistors Tr18 of the plurality of bad block latches 53.

The node PBUSBS is commonly connected to the first terminals of the transistors Tr17 of the plurality of bad block latches 53. Further, the node PBUSBS is connected to the transistors Tr19, Tr20, and Tr21. In the example of FIG. 8, the transistors Tr19 and Tr20 have a p-type polarity, and the transistor Tr21 has an n-type polarity.

The transistor Tr19 includes a first terminal to which the voltage VDD is supplied, a second terminal connected to a node PBUSBS, and a gate connected to a node PBUSBSEN. In the sensing operation of the bad block latch 53, a signal for initializing the node PBUSBS is transferred to the node PBUSBSEN.

The transistors Tr20 and Tr21 form a complementary metal oxide semiconductor (CMOS) circuit. Specifically, the transistor Tr20 includes a first terminal to which the voltage VDD is supplied, a second terminal connected to a node BBSOUT, and a gate connected to the node PBUSBS. The transistor Tr21 includes a first terminal to which the voltage VSS is supplied, a second terminal connected to the node BBSOUT, and a gate connected to the node PBUSBS. The transistors Tr20 and Tr21 function as a comparator circuit for outputting the voltage VDD ("H" level) or the voltage VSS ("L" level) to the node BBSOUT depending on whether the signal level transferred to the node PBUSBS exceeds a certain threshold value (for example, the voltage VDD/2).

The node BBSOUT is the output end for the sense result of the bad block latch 53 sensed at the node PBUSBS, and the sense result can be held in a latch circuit (not illustrated). Specifically, in a case where the node BBSOUT is at the "H" level, it is determined that the block BLK corresponding to the bad block latch 53 to be sensed is not a bad block, and in a case where the node BBSOUT is at the "L" level, it is determined that the block BLK corresponding to the bad block latch 53 is a bad block.

1.2 Bad Block Sensing Operation

Next, an outline of a bad block sensing operation according to the first embodiment will be described.

Figure 9:
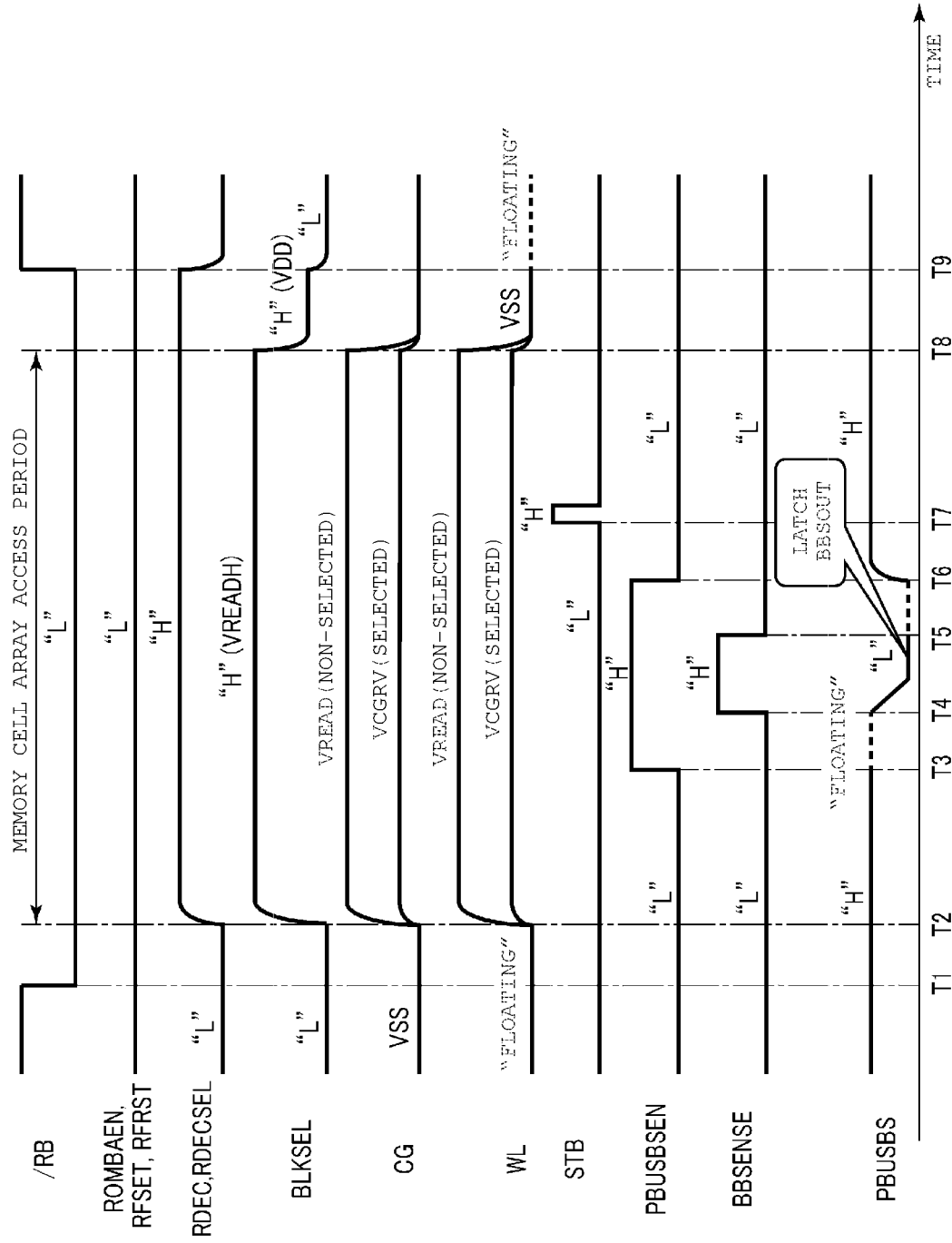
FIG. 9 is a timing chart for explaining a sensing operation of information set in the bad block latch of the semiconductor memory device according to the first embodiment.
Figure 10:
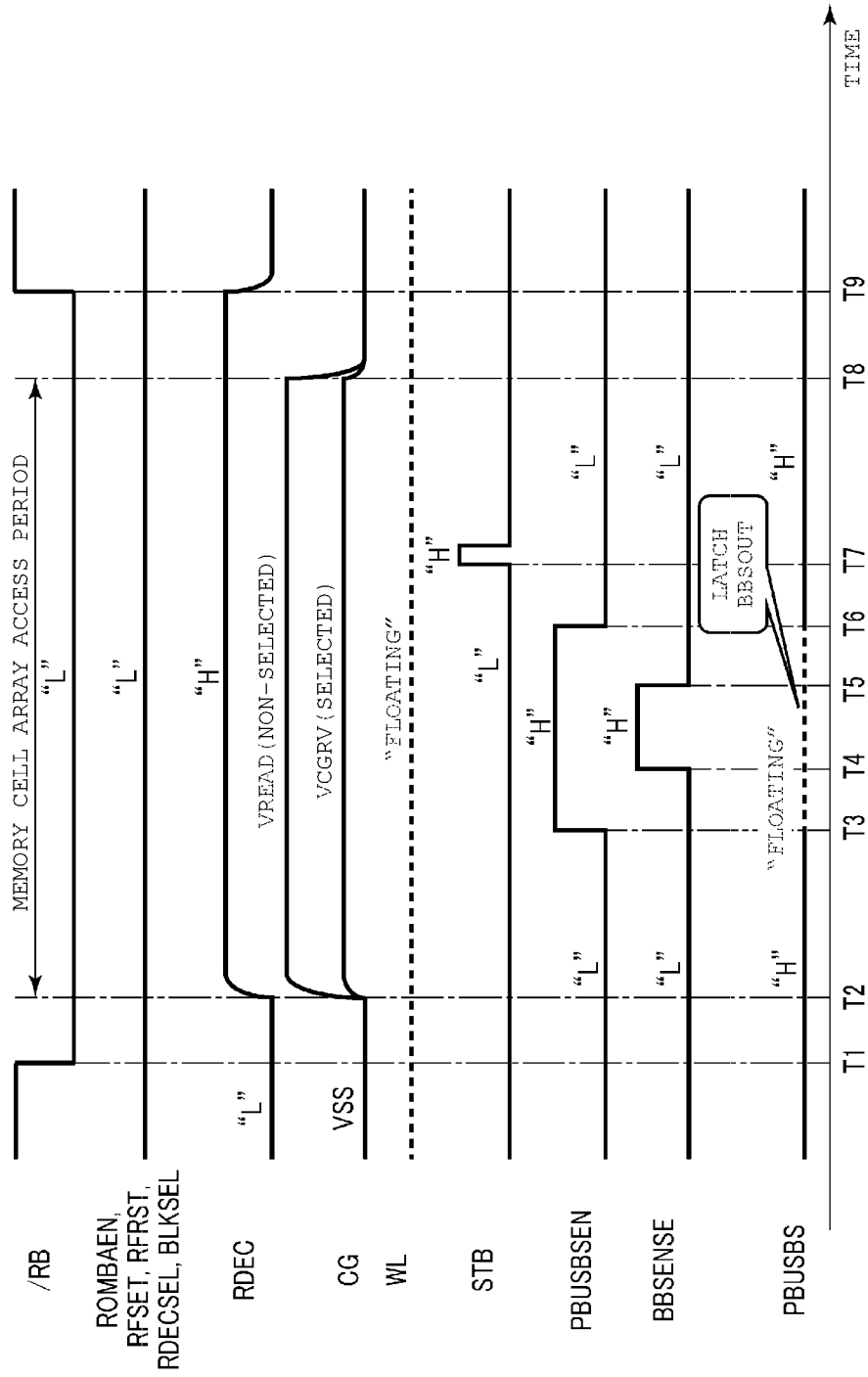
FIG. 10 is another timing chart for explaining the sensing operation of information set in the bad block latch of the semiconductor memory device according to the first embodiment.

In this example, as an example, a sensing operation of a bad block executed along with a read operation will be described with reference to FIGS. 9 and 10. FIG. 9 illustrates a timing chart for explaining the sensing operation in a case where the selected block BLK is not a bad block. FIG. 10 illustrates a timing chart for explaining the sensing operation in a case where the selected block BLK is a bad block.

In the following description, in a case where the memory cell transistor MT and the word line WL or the wiring CG connected to the memory cell transistor MT are write targets, "selected" is added to each name. In a case where the memory cell transistor MT and the word line WL or the wiring CG is not write targets of data, "non-selected" is added to each name.

1.2.1 Sensing Operation in a Case Where Selected Block is Not a Bad Block

First, the sensing operation of the bad block in a case where the selected block BLK is not a bad block will be described with reference to FIG. 9. That is, in the example of FIG. 9, the "H" level and "L" level are set for the nodes GD_A and BD_A in advance, respectively.

As illustrated in FIG. 9, up to time T1, the semiconductor memory device 20 receives a command from the controller 10 to execute a read operation.

At time T1, the logic control circuit 23 sets the signal /RB to the "L" level, informs the controller 10 that the semiconductor memory device 20 is in the busy state, and starts execution of the read operation.

At the point in time T1, the nodes RDEC and ROMBAEN are set to the "L" level. Accordingly, the nodes RDECSEL and BLKSEL are set at the "L" level. The wiring CG is at the voltage VSS. The transfer transistors TTr0 to TTr7 for transferring the voltage of the wiring CG to the word line WL among the transfer transistors TTr in the transfer switch group 51 are turned OFF, and thus, the word line WL enters a floating state. Also, the nodes PBUSBSEN and BBSENSE are set to the "L" level. Accordingly, the node PBUSBS is set to the "H" level. It is assumed that the transistors Tr3 to Tr5 are in the OFF state unless otherwise specified.

At time T2, the sequencer 25 sets the node RDEC to the "H" level, and continues to keep the node ROMBAEN at the "L" level. With this, in the block decoder 52 of the selected block BLK, the transistors Tr1 and Tr12 are turned OFF and the transistors Tr6 to Tr11 are turned ON. Also, as described above, since the selected block BLK is not a bad block, the transistor Tr13 is in the ON state, and the "L" level is transferred to the node N2 via the node N1. Accordingly, the node RDECSEL goes to the "H" level and the "H" level is output to the node BLKSEL. Further, the transistors Tr16 and Tr17 are turned ON.

At time T2, the voltage applied to the selected block BLK from the driver set 27, along with the execution of the read operation, is supplied to the wiring CG. Specifically, a voltage VCGRV is supplied to a selected wiring CG and the voltage VREAD is supplied to a non-selected wiring CG.

The voltage VCGRV is a voltage that is smaller than the voltage VREAD and is a generic name for voltages of a plurality of magnitudes applied to the selected word line WL in a read operation. Each of the plurality of magnitudes of voltages corresponds to stored data, and turns ON the memory cell transistor MT according to stored data.

Here, in order to transfer the voltages VCGRV and VREAD to the word line WL, the voltage VSS is supplied to the gate of the transistor Tr4. With this, the voltage VREADH is supplied to the level shifter LS via the node VBST, and the "H" level output to the node BLKSEL is boosted to the voltage VREADH. With this, the voltages VCGRV and VREAD transferred to the wiring CG are transferred to the word line WL via the transfer switch group 51.

As such, a period during which the voltage is supplied to the wiring CG in order to write, read, or erase data in the memory cell transistor MT is also referred to as a "memory cell array access period". That is, time T2 is the start point in time of the memory cell array access period.

At time T3, the sequencer 25 sets the node PBUSBSEN to "H" level. With this, the transistor Tr19 is turned OFF, and the node PBUSBS changes from the "H" level state to the floating state.

At time T4, the sequencer 25 sets the node BBSENSE to the "H" level. With this, the transistor Tr18 is turned ON, the node PBUSBS is pulled down to the "L" level from the floating state, and the node BBSOUT is set to the "H" level. While the node BBSENSE is at the "H" level, the sequencer 25 latches the signal level of the node BBSOUT and senses information indicating that the selected block BLK is not a bad block.

At time T5, the sequencer 25 sets the node BBSENSE to the "L" level. With this, the transistor Tr18 is turned OFF, and the node PBUSBS enters a floating state.

At time T6, the sequencer 25 sets the node PBUSBSEN to the "L" level. With this, the transistor Tr19 is turned ON, and the node PBUSBS is pulled up to the "H" level.

At time T7, the sequencer 25 sets the signal STB to the "H" level. With this, the sense amplifier SA latches a state of the sense node of data into an internal latch circuit and reads data from the memory cell transistor MT.

At time T8, the sequencer 25 turns OFF the transistor Tr4 and supplies the voltage VDDH to the gate of the transistor Tr3 to turn ON the transistor Tr3. With this, the voltage output from the node BLKSEL becomes the voltage VDD, and the transfer switch group 51 maintains the ON state to the extent that the voltage of the word line WL can be discharged. Further, the driver set 27 stops supplying the voltages VCGRV and VREAD to the wiring CG. Accordingly, the wiring CG and the word line WL are at the voltage VSS. That is, time T8 is the end point in time of the memory cell array access period.

At time T9, the sequencer 25 sets the node RDEC to the "L" level and turns OFF the transistor Tr3. With this, the transistors Tr1 and Tr11 are turned ON and OFF, respectively, and the "H" level is transferred to the node N2. For that reason, the nodes RDECSEL and BLKSEL are set to the "L" level. Accordingly, the transfer switch group 51 is turned OFF, and the word line WL enters a floating state. The logic control circuit 23 sets the signal /RB to the "H" level to inform the controller 10 that the semiconductor memory device 20 is in the ready state, and execution of the read operation is ended.

By operating as described above, it is possible to sense information that the selected block BLK is not a bad block during the memory cell array access period of the read operation.

1.2.2 Sensing Operation in a Case Where Selected Block is a Bad Block

Next, the sensing operation of the bad block in a case where the selected block BLK is a bad block will be described with reference to FIG. 10. That is, in the example of FIG. 10, the "L" level and "H" level are set for the nodes GD_A and BD_A in advance, respectively.

Times T1 to T9 in FIG. 10 correspond to times T1 to T9 described in FIG. 9.

As illustrated in FIG. 10, since the operation up to time T1 is the same as in the case of FIG. 9, description thereof will be omitted.

At time T2, the sequencer 25 sets the node RDEC to the "H" level and continues to keep the node ROMBAEN at the "L" level. With this, in the block decoder 52 of the selected block BLK, the transistors Tr1 and Tr12 are turned OFF and the transistors Tr6 to Tr11 are turned ON. Also, as described above, since the selected block BLK is a bad block, the transistor Tr13 is in an OFF state. For that reason, the "H" level is transferred to the node N2 via the transistor Tr2. Accordingly, the nodes RDECSEL and BLKSEL continue to be at the "L" level. The transistors Tr16 and Tr17 are turned OFF.

At time T2, the voltages VCGRV and VREAD applied to the selected block BLK from the driver set 27, along with the execution of the read operation, are transferred to the wiring CG. That is, time T2 is the start point in time of the memory cell array access period. However, since the node BLKSEL is at the "L" level as described above, the transfer switch group 51 remains in the OFF state, and the voltages VCGRV and VREAD are not transferred to the word line WL.

At time T3, the sequencer 25 sets the node PBUSBSEN to "H" level. With this, the transistor Tr19 is turned OFF, and the node PBUSBS goes from the "H" level state to the floating state.

At time T4, the sequencer 25 sets the node BBSENSE to "H" level. With this, the transistor Tr18 is turned ON, while the transistor Tr17 is in the OFF state. For that reason, the floating state of the node PBUSBS at the "H" level is maintained, and the node BBSOUT is at the "L" level. While the node BBSENSE is at the "H" level, the sequencer 25 latches the signal level of the node BBSOUT and senses information that the selected block BLK is a bad block.

At time T5, the sequencer 25 sets the node BBSENSE to the "L" level. With this, the transistor Tr18 is turned OFF.

At time T6, the sequencer 25 sets the node PBUSBSEN to the "L" level. With this, the transistor Tr19 is turned ON, and the node PBUSBS is set to the "H" level.

At time T7, the sequencer 25 sets the signal STB to the "H" level. However, as described above, since the node BLKSEL is at the "L" level, the transfer switch group 51 remains in the OFF state. For that reason, the voltages VCGRV and VREAD are not transferred to the word line WL, and data is not read from the memory cell transistor MT.

At time T8, the driver set 27 stops supplying the voltages VCGRV and VREAD to the wiring CG. That is, time T8 is the end point in time of the memory cell array access period.

At time T9, the sequencer 25 sets the node RDEC to the "L" level. The logic control circuit 23 sets the signal /RB to the "H" level to inform the controller 10 that the semiconductor memory device 20 is in the ready state, and execution of the read operation is ended.

By operating as described above, it is possible to sense information that the selected block BLK is a bad block in the memory cell array access period of the read operation.

In the examples of FIGS. 9 and 10, a case where the sensing operation of data at time T7 is performed after the sensing operation of the bad block at time T3 to T6 is illustrated, but the embodiment is not limited thereto. For example, the sensing operation of the bad block may be executed after the sensing operation of the data, or the sensing operation of the bad block may be executed in parallel with the sensing operation of the data for a portion of or the entire period of the sensing operation of the bad block.

1.3 Effects According to First Embodiment

According to the first embodiment, the access time to a memory cell can be shortened. This effect will be described below.

The sequencer 25 maintains the node ROMBAEN at the "L" level while setting the node RDEC to the "H" level, during the sensing operation of the bad block. With this, the node RDECSEL goes to the "L" level if the bad block latch 53 is set (that is, if the corresponding block BLK is a bad block), and the node RDECSEL goes to the "H" level if the bad block latch 53 is reset (that is, if the corresponding block BLK is not a bad block). That is, the period during which the node RDEC is at the "H" level and the node ROMBAEN at the "L" level is a period in which the logic level of the node RDECSEL can be changed depending on whether or not the bad block latch 53 is set. For that reason, the transistor Tr17 can be switched between the ON state and the OFF state, depending on whether or not the bad block latch 53 is set during the period.

Specifically, the transistor Tr17 includes a first terminal connected to the node PBUSBS, a second terminal to which the voltage VSS is supplied through the transistor Tr18, a gate connected to a node RDECSEL. With this, if the bad block latch 53 is set (that is, if the corresponding block BLK is a bad block), the node PBUSBS remains in the floating state transitioning from the "H" level state, and if the bad block latch 53 is reset (that is, if the corresponding block BLK is not a bad block), the node PBUSBS is pulled down to the "L" level. For that reason, the node BBSOUT can have the logic levels inverted to each other, depending on whether or not the bad block latch 53 is set. Accordingly, the sequencer 25 can sense whether or not the bad block latch 53 is set.

As described above, the logic level of the node PBUSBS is determined according to the logic level of the node RDECSEL. For that reason, in the node PBUSBS, the configuration in which information indicating whether the bad block latch 53 is set or not is directly referred to can be omitted. Specifically, in the node PBUSBS, a transistor for directly referring to the logic level of the node GD or BD can be omitted. Accordingly, it is possible to reduce a circuit area for the corresponding transistor.

Also, as described above, the node ROMBAEN is maintained at the "L" level during the sensing operation of the bad block. With this, it is possible to avoid the node RDECSEL form going to the "H" level irrespective of whether or not the bad block latch 53 is set. For that reason, when the bad block sensing operation is performed, in a case where the bad block latch 53 is set (that is, the corresponding block BLK is a bad block), the node BLKSEL never goes to the "H" level. That is, in the case where the sensing operation of the bad block is executed within the memory cell array access period, it is possible to prevent an unintentional current from flowing from the wiring CG to the word line WL, with respect to the block BLK in which the bad block latch 53 is set. Accordingly, the sensing operation of the bad block can be executed within the memory cell array access period, and eventually the access time to the memory cell can be shortened as compared with the case where the sensing operation of the bad block is executed outside the memory cell array access period.

Second Embodiment

Next, a semiconductor memory device according to a second embodiment will be described. The bad block latch in the semiconductor memory device according to the first embodiment has a configuration in which a path for setting or resetting a latch circuit is different from a path for sensing whether or not it is a bad block. On the other hand, a bad block latch in the semiconductor memory device according to the second embodiment has a configuration in which a path for setting or resetting the latch circuit and a path for sensing whether or not it is a bad block are shared. In the following, the same elements as those of the first embodiment are denoted by the same reference numerals, explanation thereof will be omitted, and only the portions different from those of the first embodiment will be described.

2.1 Configuration

First, a configuration of the semiconductor memory device according to the second embodiment will be described.

2.1.1 Configuration of Block Decoder

Figure 11:
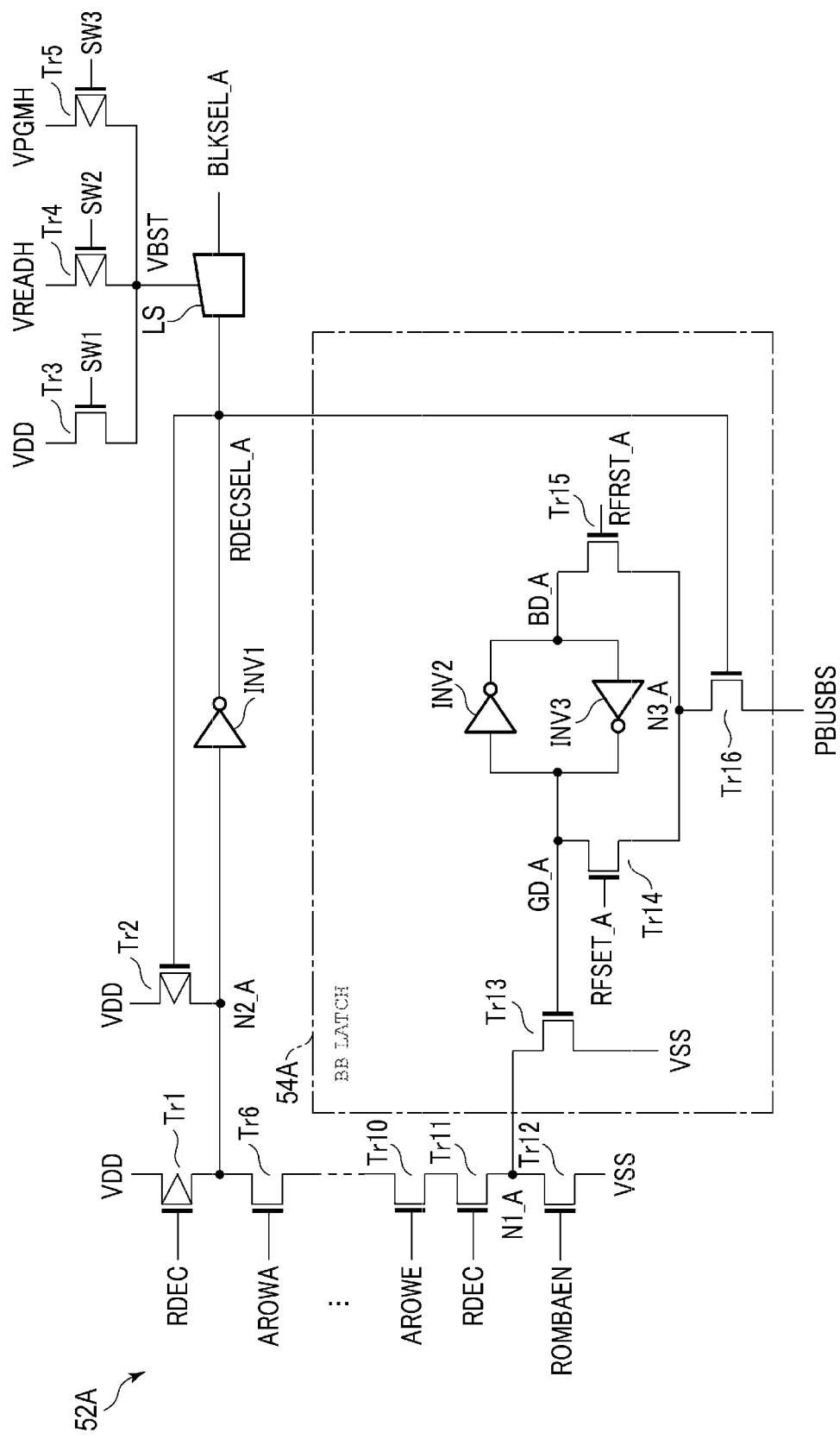
FIG. 11 is a circuit diagram for explaining a configuration of a block decoder of a semiconductor memory device according to a second embodiment.

A configuration of the block decoder of the semiconductor memory device according to the second embodiment will be described with reference to FIG. 11. FIG. 11 corresponds to FIG. 7 described in the first embodiment, and illustrates a configuration including a bad block latch 54A instead of the bad block latch 53A.

As illustrated in FIG. 11, the bad block latch 54A includes the transistors Tr13 to Tr16 and the inverters INV2 and INV3, but does not include the transistors Tr17 and Tr18 illustrated in FIG. 7.

Since the configurations of the transistors Tr13 to Tr15 and the inverters INV2 and INV3 are the same as those of the first embodiment, the description thereof will be omitted.

The transistor Tr16 includes a first terminal connected to the node N3_A, a second terminal connected to the node PBUSBS, and a gate connected to the node RDECSEL_A.

The node PBUSBS is shared as a path for setting or resetting the bad block latch 54 and as a path for sensing the bad block latch 54. Specifically, in a case of setting or resetting the bad block latch 54, the "L" level is transferred to the node PBUSBS. In the sensing operation of the bad block, the node PBUSBS enters a floating state of "H" level in a case where the block BLK corresponding to the bad block latch 54 to be sensed is a bad block, and goes to the "L" level in a case where the block BLK corresponding to the bad block latch 54 to be sensed is not a bad block.

The bad block latch 54A is desirably designed such that the logic level of the node BD_A is not inverted by the voltage of the node PBUSBS, in a case where the nodes BD_A and PBUSBS are electrically connected.

2.1.2 Configuration of Sense Node of Bad Block Latch

Figure 12:
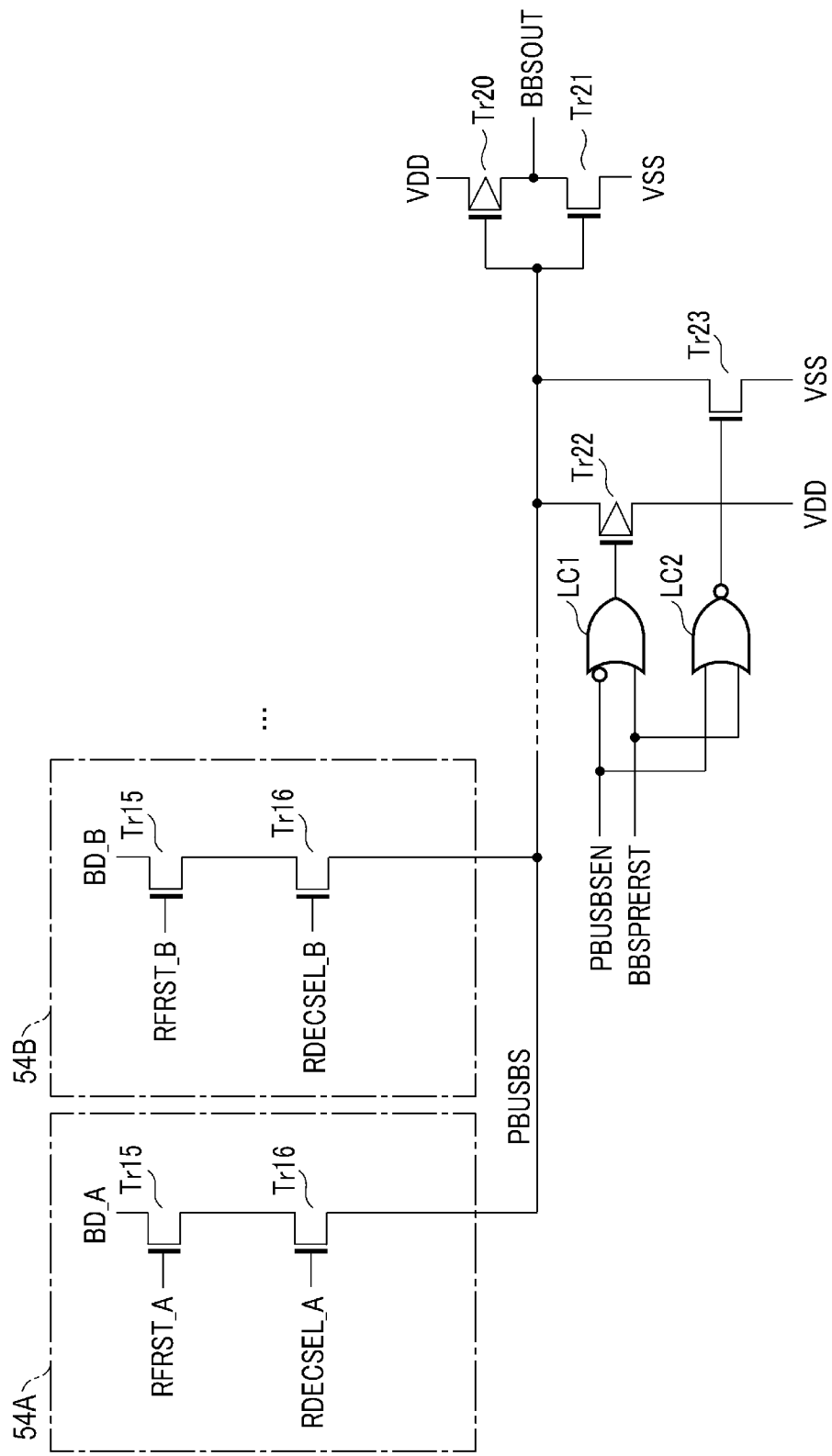
FIG. 12 is a circuit diagram for explaining a sense node of a bad block latch of the semiconductor memory device according to the second embodiment.

Next, the configuration of the sense node of the bad block latch of the semiconductor memory device according to the second embodiment will be described with reference to FIG. 12. FIG. 12 corresponds to FIG. 8 described in the first embodiment, and illustrates the connection relationship between the plurality of bad block latches 54 (54A, 54B, . . . ) and the nodes PBUSBS and BBSPRERST.

As illustrated in FIG. 12, the node PBUSBS is commonly connected to the second terminals of the transistors Tr16 of the plurality of bad block latches 54. The node PBUSBS is further connected to the transistors Tr22 and Tr23 in addition to the transistors Tr20 and Tr21, but is not connected to the transistor Tr19 illustrated in FIG. 8. In the example of FIG. 12, the transistor Tr22 has the p-type polarity, and the transistor Tr23 has the n-type polarity.

The transistor Tr22 includes a first terminal to which the voltage VDD is supplied, a second terminal connected to the node PBUSBS, and a gate connected to an output terminal of a logic circuit LC1.

The logic circuit LC1 includes a first input terminal connected to the node PBUSBSEN and a second input terminal connected to the node BBSPRERST. The logic circuit LC1 outputs a logical sum (OR) operation result of a logical negation (NOT) operation result of a signal input from the first input terminal and a signal input from the second input terminal, to the output terminal. That is, the logic circuit LC1 outputs the "L" level in a case where the node PBUSBSEN is at the "H" level and the node BBSPRERST is at the "L" level, and outputs the "H" level in other cases.

The transistor Tr23 includes a first terminal to which the voltage VSS is supplied, a second terminal connected to the node PBUSBS, and a gate connected to an output terminal of a logic circuit LC2.

The logic circuit LC2 includes a first input terminal connected to the node PBUSBSEN and a second input terminal connected to the node BBSPRERST. The logic circuit LC2 outputs a not logical sum (NOR) operation result of the signal input from the first input terminal and a signal input from the second input terminal, to the output terminal. That is, the logic circuit LC2 outputs the "H" level in a case where the node PBUSBSEN is at the "L" level and the node BBSPRERST is at the "L" level, and outputs the "L" level in other cases.

The node BBSOUT is an output terminal of the sense result of the bad block latch 54 sensed at the node PBUSBS, and the sense result can be held in a latch circuit (not illustrated). Specifically, in a case where the node BBSOUT is at the "H" level, it is determined that the block BLK corresponding to the bad block latch 54 to be sensed is not a bad block, and in a case where the node BBSOUT is at the "L" level, it is determined that the block BLK corresponding to the bad block latch 54 is a bad block.

2.2 Sensing Operation of Bad Block

Next, the outline of the sensing operation of the bad block according to the second embodiment will be described.

Figure 13:
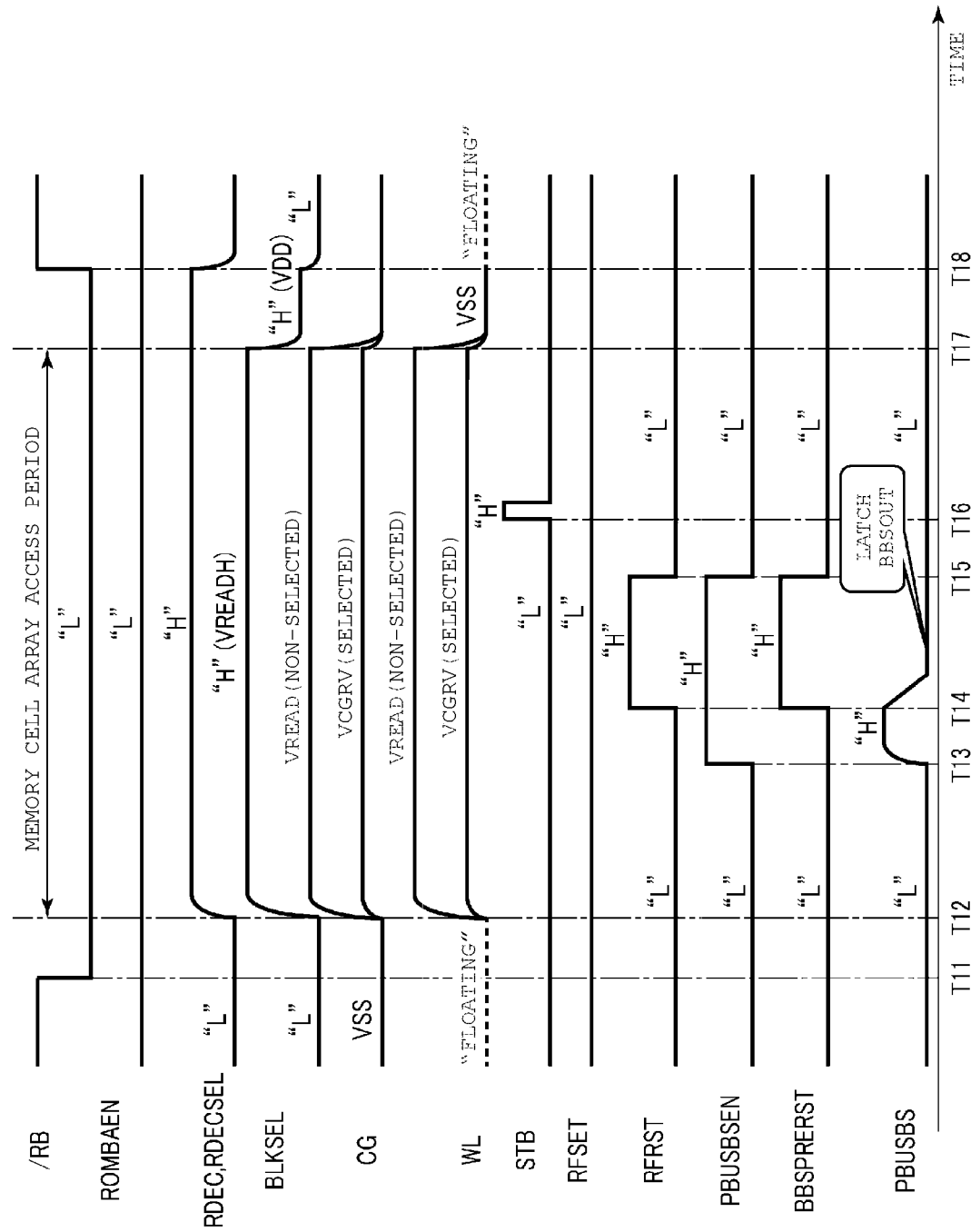
FIG. 13 is a timing chart for explaining a sensing operation of information set in the bad block latch of the semiconductor memory device according to the second embodiment.
Figure 14:
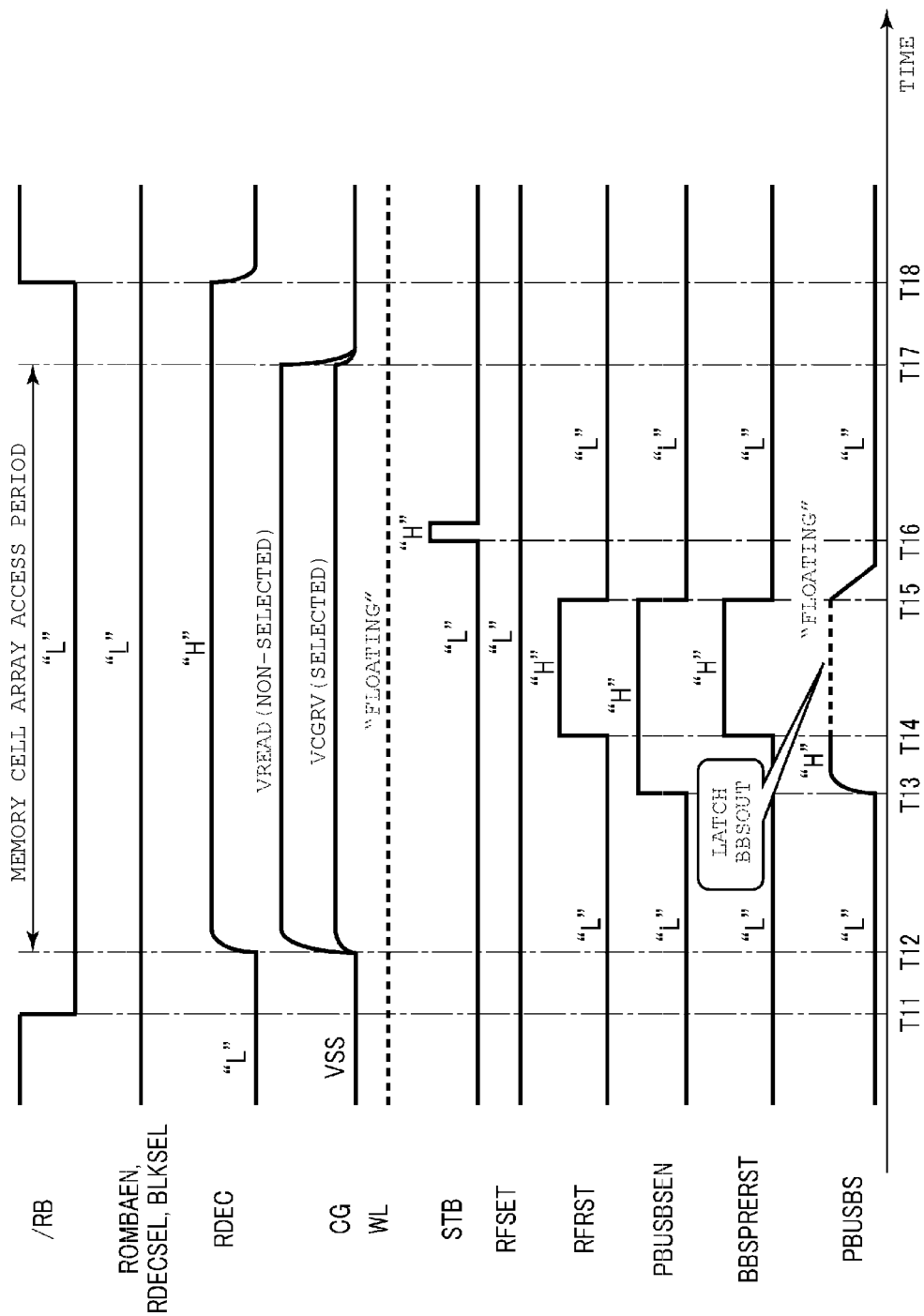
FIG. 14 is another timing chart for explaining the sensing operation of information set in the bad block latch of the semiconductor memory device according to the second embodiment.

In this example, as an example, a sensing operation of a bad block executed along with a read operation will be described with reference to FIGS. 13 and 14. FIGS. 13 and 14 correspond to FIGS. 9 and 10 described in the first embodiment. That is, FIG. 13 illustrates a timing chart for explaining the sensing operation in a case where the selected block BLK is not a bad block. FIG. 14, illustrates a timing chart for explaining the sensing operation in a case where the selected block BLK is a bad block is illustrated.

2.2.1 Sensing Operation in a Case Where Selected Block is Not a Bad Block

First, the sensing operation of the bad block in a case where the selected block BLK is not a bad block will be described with reference to FIG. 13. That is, in the example of FIG. 13, the "H" level and "L" level are set for the nodes GD_A and BD_A in advance, respectively.

As illustrated in FIG. 13, since the operations at times T11 and T12 are the same as the operations at times T1 and T2 described in FIG. 9, the description thereof will be omitted. At the point in time T11, the nodes PBUSBSEN and BBSPRERST are set to the "L" level. Along with this, the transistors Tr22 and Tr23 are turned OFF and ON, respectively, and the node PBUSBS goes to the "L" level.

At time T13, the sequencer 25 sets the node PBUSBSEN to the "H" level. With this, the transistors Tr22 and Tr23 are turned ON and OFF, respectively, and the node PBUSBS is pulled up to the "H" level.

At time T14, the sequencer 25 sets the node RFRST to the "H" level. With this, the transistor Tr15 is turned ON, and the node BD and the node PBUSBS are connected. The sequencer 25 sets the node BBSPRERST to the "H" level. With this, the transistor Tr22 is turned OFF, the node PBUSBS is pulled down due to the "L" level set to the node BD_A, and the node BBSOUT is set to the "H" level. While the node BBSPRERST is at the "H" level, the sequencer 25 latches the signal level of the node BBSOUT and senses information that the selected block BLK is not a bad block.

At time T15, the sequencer 25 sets the node RFRST to the "L" level. With this, the transistor Tr15 is turned OFF, and the node BD and the node PBUSBS are electrically disconnected. The sequencer 25 sets the nodes PBUSBSEN and BBSPRERST to the "L" level. With this, the transistors Tr22 and Tr23 are turned OFF and ON, respectively, and the node PBUSBS is maintained at the "L" level.

The operations at times T16, T17, and T18 are similar to the operations at times T7 to T9 described in FIG. 9 and thus, the description thereof will be omitted. That is, time T17 is the end point in time of the memory cell array access period, and the read operation ends at time T18.

By operating as described above, it is possible to sense information that the selected block BLK is not a bad block during the memory cell array access period of the read operation.

2.2.2 Sensing Operation in a Case Where Selected Block is Bad Block

Next, the sensing operation of the bad block in a case where the selected block BLK is a bad block will be described with reference to FIG. 14. That is, in the example of FIG. 14, the "L" level and "H" level are set for nodes GD_A and BD_A in advance, respectively.

Times T11 to T18 in FIG. 14 correspond to times T11 to T18 described in FIG. 13.

As illustrated in FIG. 14, since the operation up to time T11 is the same as in the case of FIG. 13, the description thereof will be omitted.

At time T12, sequencer 25 sets the node RDEC to the "H" level and continues to keep the node ROMBAEN at the "L" level. With this, in the block decoder 52 of the selected block BLK, the transistors Tr1 and Tr12 are turned OFF and the transistors Tr6 to Tr11 are turned ON. As described above, since the selected block BLK is a bad block, the transistor Tr13 is in an OFF state. For that reason, the "H" level is transferred to the node N2 via the transistor Tr2. Accordingly, the nodes RDECSEL and BLKSEL continue to be at the "L" level. Further, the transistor Tr16 is turned OFF.

At time T12, the voltages VCGRV and VREAD applied to the selected block BLK from the driver set 27, along with the execution of the read operation, are transferred to the wiring CG. That is, time T12 is the start point in time of the memory cell array access period. However, since the node BLKSEL is at the "L" level as described above, the transfer switch group 51 remains in the OFF state, and the voltages VCGRV and VREAD are not transferred to the word line WL.

At time T13, the sequencer 25 sets the node PBUSBSEN to the "H" level. With this, the transistors Tr22 and Tr23 are turned ON and OFF, respectively, and the node PBUSBS goes to the "H" level.

At time T14, the sequencer 25 sets the node RFRST to the "H" level. With this, the transistor Tr15 is turned ON, but since the transistor Tr16 is in the OFF state, the node BD and the node PBUSBS are not connected. The sequencer 25 sets the node BBSPRERST to the "H" level. With this, the transistor Tr22 is turned OFF, the node PBUSBS changes from the "H" level to the floating state, and the node BBSOUT goes to the "L" level. While the node BBSPRERST is at the "H" level, the sequencer 25 latches the signal level of the node BBSOUT and senses information indicating that the selected block BLK is a bad block.

At time T15, the sequencer 25 sets the node RFRST to the "L" level. With this, the transistor Tr15 is turned OFF. The sequencer 25 sets the nodes PBUSBSEN and BBSPRERST to the "L" level. With this, the transistors Tr22 and Tr23 are turned OFF and ON, respectively, and the node PBUSBS is pulled down to the "L" level.

Since the operations at and after time T16 is the same as those in the case of FIG. 13, the description thereof will be omitted. That is, time T17 is the end point in time of the memory cell array access period, and the read operation ends at time T18.

By operating as described above, it is possible to sense information that the selected block BLK is a bad block during the memory cell array access period of the read operation.

In the examples of FIGS. 13 and 14, the case where the sensing operation of data at time T16 is executed after the sensing operation of the bad block at time T13 to T15 is illustrated, but the embodiment is not limited thereto. For example, the sensing operation of the bad block may be executed after the sensing operation of the data, or may be executed in parallel with the sensing operation of the data for a portion of or the entire period of the sensing operation of the bad block.

2.3 Effects of Second Embodiment

According to the second embodiment, the transistor Tr16 is switched between the ON state and the OFF state according to the logic level of the node RDECSEL. Specifically, the transistor Tr16 includes a first terminal connected to the node BD via the transistor Tr15, a second terminal connected to the node PBUSBS, and a gate connected to the node RDECSEL. With this, the node PBUSBS enters a floating state from the "H" level if the bad block latch 54 is set (that is, if the corresponding block BLK is a bad block) during the sensing operation of the bad block, and the node PBUSBS is pulled down to the "L" level if the bad block latch 54 is reset (that is, if the corresponding block BLK is not a bad block). For that reason, the node BBSOUT can have different logic levels depending on whether or not the bad block latch 54 is set. Accordingly, the sequencer 25 can sense whether or not the bad block latch 54 is set.

When the bad block latch 54 is set or reset, the node PBUSBS is pulled down to the "L" level via the transistor Tr23. With this, the node PBUSBS can be shared as a path for setting or resetting the bad block latch 54 and as a path for sensing the bad block latch 54. For that reason, the transistors (for example, transistors Tr17 and Tr18) not used for setting or resetting the bad block latch 54 and used for sensing the bad block latch 54 can be omitted. Accordingly, the circuit area of the transistor can be reduced, it is possible to sense the bad block latch 54 during the memory cell array access period by the operation of sensing the node RDECSEL reflecting the output of the bad block latch 54 by the transistor Tr 16 while setting the node ROMBAEN to the "L" level.

3. Modification Example and the Like

The embodiment is not limited to embodiments described in the first embodiment and the second embodiment, and various modifications may be made thereto.

3.1 First Modification Example

In the first embodiment described above, the case where the sensing operation of the bad block is executed within the memory cell array access period of the read operation has been described, but the embodiment is not limited thereto.

For example, the sensing operation of the bad block may be executed within the memory cell array access period for a write operation. Hereinafter, description of the configuration and operation similar to those of the first embodiment will be omitted, and the configuration and operation different from those of the first embodiment will be mainly described.

Figure 15:
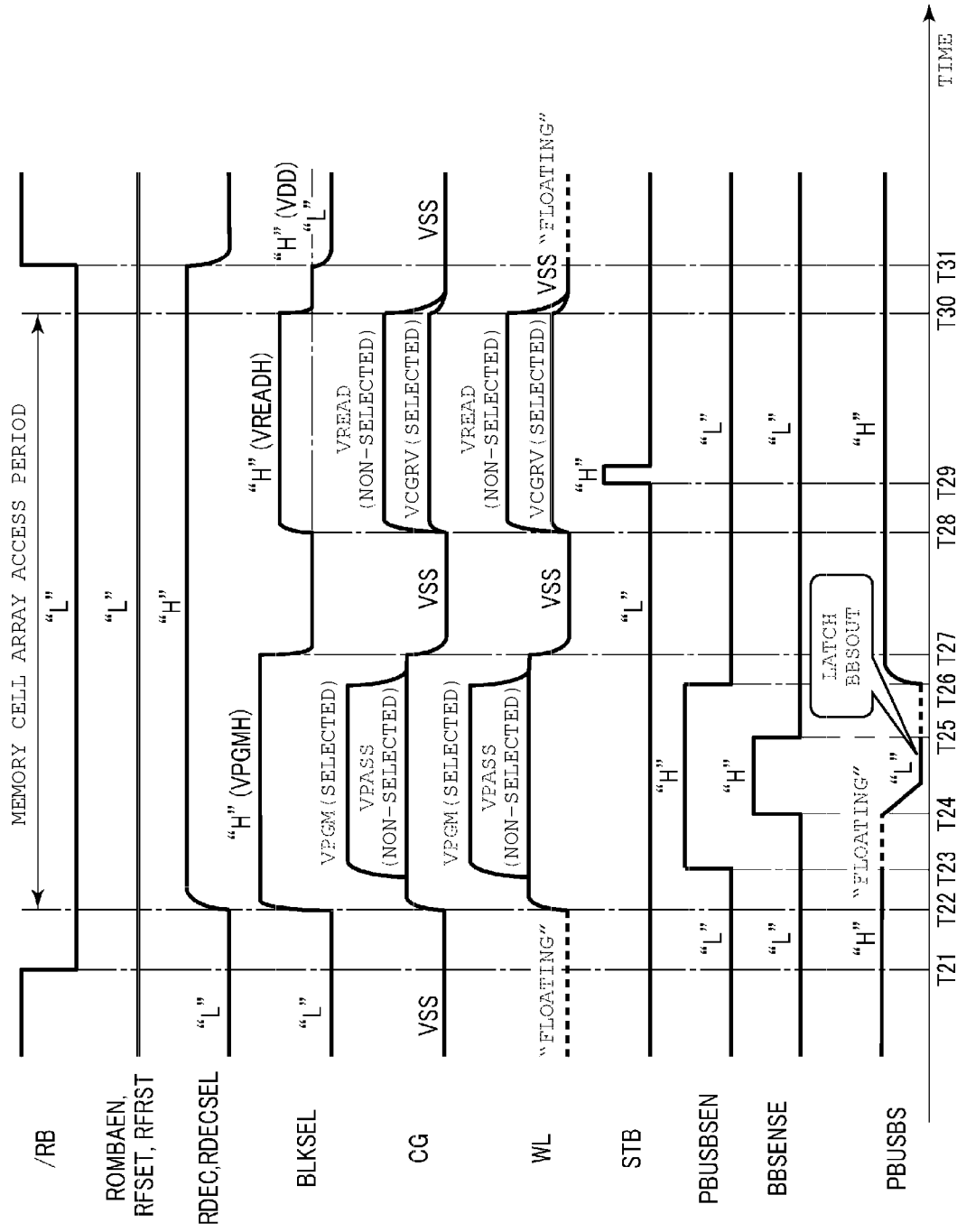
FIG. 15 is a timing chart for explaining a sensing operation of information set in a bad block latch of a semiconductor memory device according to a first modification example.
Figure 16:
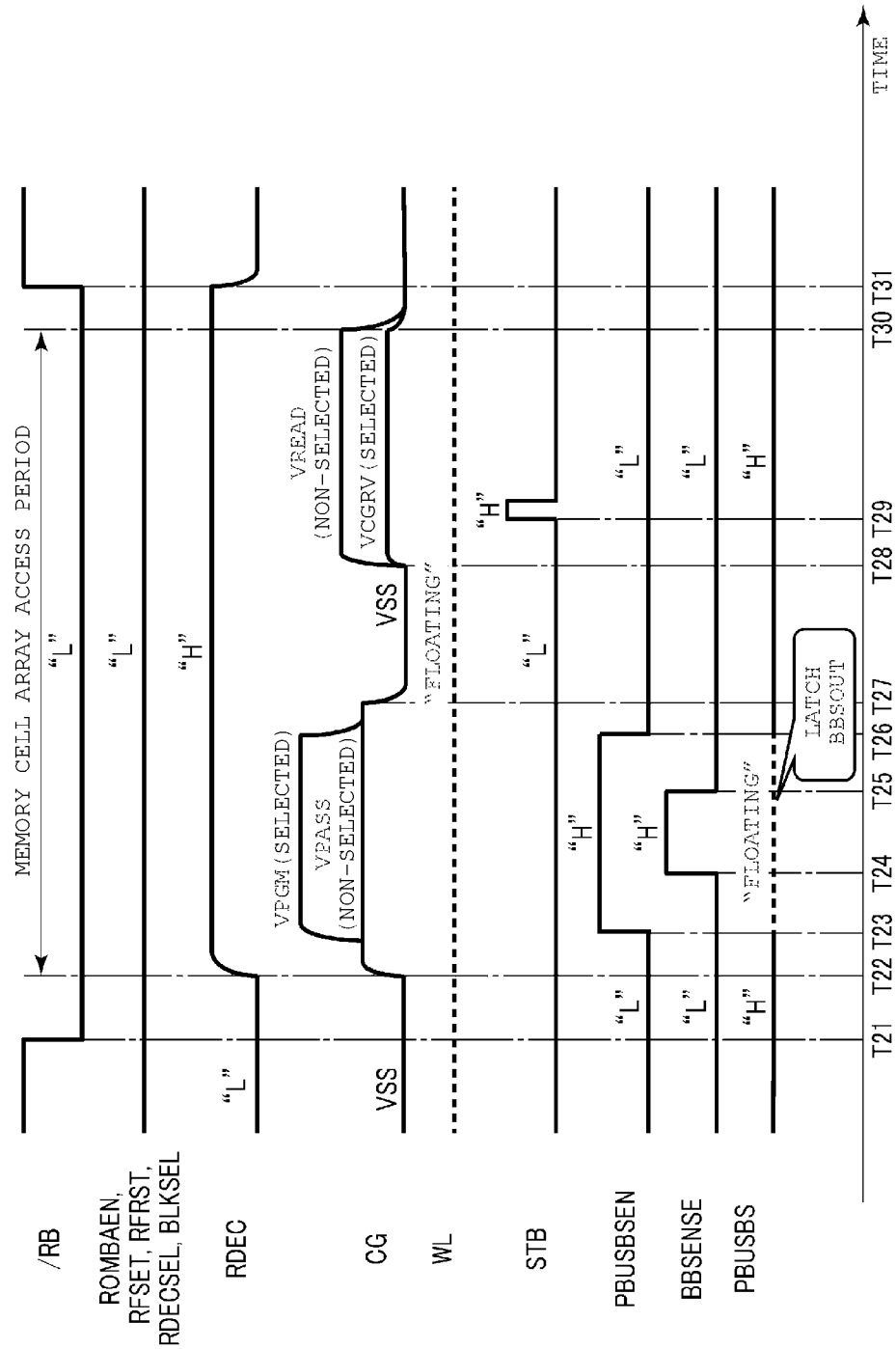
FIG. 16 is another timing chart for explaining the sensing operation of information set in the bad block latch of the semiconductor memory device according to the first modification example.

First, a case where the sensing operation of the bad block is executed within the memory cell array access period of the write operation will be described with reference to FIGS. 15 and 16. FIGS. 15 and 16 correspond to FIGS. 9 and 10, respectively, described in the first embodiment.

3.1.1 Sensing Operation in a Case Where Selected Block is Not a Bad Block

The sensing operation of the bad block in a case where the selected block BLK is not a bad block will be described with reference to FIG. 15. That is, in the example of FIG. 15, the "H" level and "L" level are set for nodes GD_A and BD_A in advance, respectively.

As illustrated in FIG. 15, up to time T21, the semiconductor memory device 20 receives a command from the controller 10 to execute a write operation. The write operation includes a program operation and a verification operation. In the example of FIG. 15, the program operation corresponds to a period from time T22 to time T27, and the verification operation corresponds to a period from time T28 to time T30.

At time T21, the logic control circuit 23 sets the signal /RB to the "L" level to inform the controller 10 that the semiconductor memory device 20 is in the busy state, and starts execution of the write operation.

At the point in time T21, the nodes RDEC and ROMBAEN are set to "L" level. Accordingly, the nodes RDECSEL and BLKSEL goes to the "L" level. The wiring CG is at the voltage VSS. The transfer transistors TTr0 to TTr7 for transferring the voltage of the wiring CG to the word line WL, among the transfer transistors TTr in the transfer switch group 51, are turned OFF, so that the word line WL enters a floating state. The nodes PBUSBSEN and BBSENSE are set to the "L" level. Accordingly, the node PBUSBS is set to the "H" level. Also, the nodes RFSET and RFRST are set to the "L" level.

At time T22, the sequencer 25 sets the node RDEC to the "H" level and continues to keep the node ROMBAEN at the "L" level. With this, in the block decoder 52 of the selected block BLK, the transistors Tr1 and Tr12 are turned OFF and the transistors Tr6 to Tr11 are turned ON. As described above, since the selected block BLK is not a bad block, the transistor Tr13 is in the ON state, and the "L" level is transferred to the node N2 via the node N1. Accordingly, the node RDECSEL goes to the "H" level and the "H" level is output to the node BLKSEL. The transistors Tr16 and Tr17 are turned ON.

At time T22, the voltage applied to the selected block BLK from the driver set 27 is supplied to the wiring CG, along with execution of the program operation. Specifically, the voltages VPASS and VPGM are supplied to the selected wiring CG, and the voltage VPASS is supplied to the non-selected wiring CG.

The voltage VPASS is smaller than the voltage VPGM, and has a magnitude that can raise a potential of a channel by coupling to the extent that the rise in a threshold voltage in the selected memory cell transistor MT can be prevented in the NAND string NS including the selected memory cell transistor MT to which electrons are not to be injected, while controlling the program to the non-selected memory cell transistor MT in the NAND string NS including the selected memory cell transistor MT to which electrons are injected.

Here, in order to transfer the voltages VPASS and VPGM to the word line WL, the voltage VSS is supplied to the gate of the transistor Tr5. With this, the voltage VPGMH is supplied to the level shifter LS via the node VBST, and the "H" level output to the node BLKSEL is boosted to the voltage VPGMH. With this, the voltages VPGM and VPASS transferred to the wiring CG are transferred to the word line WL via the transfer switch group 51. That is, time T22 is the start point in time of the memory cell array access period.

Since the operation from time T23 to time T26 is the same as the operation from time T3 to time T6 described in FIG. 9, the description thereof will be omitted.

At time T27, the sequencer 25 turns OFF the transistor Tr5 and supplies the voltage VDDH to the gate of the transistor Tr3 to turn ON the transistor Tr3. With this, the voltage output from the node BLKSEL becomes the voltage VDD, and the transfer switch group 51 maintains the ON state to the extent that the voltage of the word line WL can be discharged. Further, the driver set 27 stops supplying the voltages VPASS and VPGM to the wiring CG. Accordingly, the wiring CG and the word line WL are at the voltage VSS. By doing as described above, the program operation is ended.

At time T28, along with execution of the verification operation, the voltage to be applied to the selected block BLK from the driver set 27 is supplied to the wiring CG. Specifically, the voltage VCGRV is supplied to the selected wiring CG and the voltage VREAD is supplied to the non-selected wiring CG. A value different from the voltage VCGRV in the read operation can be applied to the voltage VCGRV in the verification operation.

The "H" level output to the node BLKSEL is boosted by the level shifter LS to the voltage VREADH by turning ON the transistor Tr4 in order to transfer the voltages VCGRV and VREAD to the word line WL. With this, the voltages VCGRV and VREAD transferred to the wiring CG are transferred to the word line WL via the transfer switch group 51.

At time T29, the sequencer 25 sets the signal STB to the "H" level. With this, the sense amplifier SA takes the state of the sense node of data into the internal latch circuit and reads data from the memory cell transistor MT.

At time T30, the sequencer 25 turns OFF the transistor Tr4 and supplies the voltage VDDH to the node SW1 to turn ON the transistor Tr3. With this, the voltage output from the node BLKSEL becomes the voltage VDD, and the transfer switch group 51 maintains the ON state to the extent that the voltage of the word line WL can be discharged. The driver set 27 stops supplying the voltages VCGRV and VREAD to the wiring CG. Accordingly, the wiring CG and the word line WL are at the voltage VSS. By doing as described above, the verification operation is ended. That is, time T30 is the endpoint in time of the memory cell array access period.

At time T31, the sequencer 25 sets the node RDEC to the "L" level and turns OFF the transistor Tr3. With this, the transistors Tr1 and Tr11 are turned ON and OFF, respectively, and the "H" level is transferred to the node N2. For that reason, the nodes RDECSEL and BLKSEL are set to the "L" level. Accordingly, the transfer switch group 51 is turned OFF, and the word line WL enters a floating state. The logic control circuit 23 sets the signal /RB to the "H" level to inform the controller 10 that the semiconductor memory device 20 is in the ready state, and execution of the write operation is ended.

By operating as described above, it is possible to sense information that the selected block BLK is not a bad block during the memory cell array access period for the write operation.

3.1.2 Sensing Operation in a Case Where Selected Block is Bad Block

Next, the sensing operation of the bad block in a case where the selected block BLK is a bad block will be described with reference to FIG. 16. That is, in the example of FIG. 16, the "L" level and "H" level are set for nodes GD_A and BD_A in advance, respectively.

Times T21 to T31 in FIG. 16 correspond to times T21 to T31 described in FIG. 15, respectively.

As illustrated in FIG. 16, since the operation up to time T21 is the same as in the case of FIG. 15, the description thereof will be omitted.

At time T22, the sequencer 25 sets the node RDEC to the "H" level and continues to keep the node ROMBAEN at the "L" level. With this, in the block decoder 52 of the selected block BLK, the transistors Tr1 and Tr12 are turned OFF and the transistors Tr6 to Tr11 are turned ON. As described above, since the selected block BLK is a bad block, the transistor Tr13 is in an OFF state. For that reason, the "H" level is transferred to the node N2 via the transistor Tr2. Accordingly, the nodes RDECSEL and BLKSEL continue to be at the "L" level. The transistors Tr16 and Tr17 are turned OFF.

At time T22, the voltages VPASS and VPGM applied to the selected block BLK from the driver set 27, along with execution of the program operation, are transferred to the wiring CG. That is, time T22 is the start point in time of the memory cell array access period. However, as described above, since the node BLKSEL is at the "L" level, the transfer switch group 51 remains in the OFF state. For that reason, the voltages VPASS and VPGM are not transferred to the word line WL, and data is not written into the memory cell transistor MT.

Since the operation from time T23 to time T26 is the same as the operation from time T3 to time T6 described in FIG. 10, the description thereof will be omitted.

At time T27, the driver set 27 stops supplying the voltages VPASS and VPGM to the wiring CG. By doing as described above, the program operation is ended.

At time T28, along with the execution of the verification operation, the voltages VCGRV and VREAD applied to the selected block BLK from the driver set 27 are transferred to the wiring CG. However, as described above, since the node BLKSEL is at the "L" level, the transfer switch group 51 remains in the OFF state, and the voltages VCGRV and VREAD are not transferred to the word line WL.

At time T29, the sequencer 25 sets the signal STB to the "H" level. However, as described above, since the node BLKSEL is at the "L" level, the transfer switch group 51 remains in the OFF state. For that reason, the voltages VCGRV and VREAD are not transferred to the word line WL, and data is not read from the memory cell transistor MT.

Since the operations at after time T30 are the same as the operations described in FIG. 15, the description thereof will be omitted. That is, at time T30, the verification operation ends and the memory cell array access period ends, and the execution of the write operation ends at time T31.

By operating as described above, it is possible to sense information that the selected block BLK is a bad block also in the memory cell array access period for the write operation.

Accordingly, even when the sensing operation of the bad block is executed in the memory cell array access period for the write operation, the same effect as the effect described in the first embodiment can be exhibited.

In the example of FIG. 15 and FIG. 16, the case where the sensing operation of data at time T29 is executed after the sensing operation of the bad block at time T23 to T26 is illustrated, but the present disclosure is not limited thereto. For example, the sensing operation of the bad block may be executed after the sensing operation of the data, or may be executed in parallel with the sensing operation of the data for a portion of or the entire period of the sensing operation of the bad block.

In the examples of FIGS. 15 and 16, the case where the sensing operation of the bad block is executed during the program operation is illustrated, but the present disclosure is not limited thereto. For example, the sensing operation of the bad block may be performed during the verification operation.

3.2 Second Modification Example

In the first modification example described above, the case where the sensing operation of the bad block is executed within the memory cell array access period for the write operation has been described, but the present disclosure is not limited to thereto. For example, the sensing operation of the bad block may be executed within the memory cell array access period for an erasing operation. Hereinafter, the description of the configuration and operation similar to those of the first embodiment will be omitted, and the configuration and operation different from those of the first embodiment will be mainly described.

Figure 17:
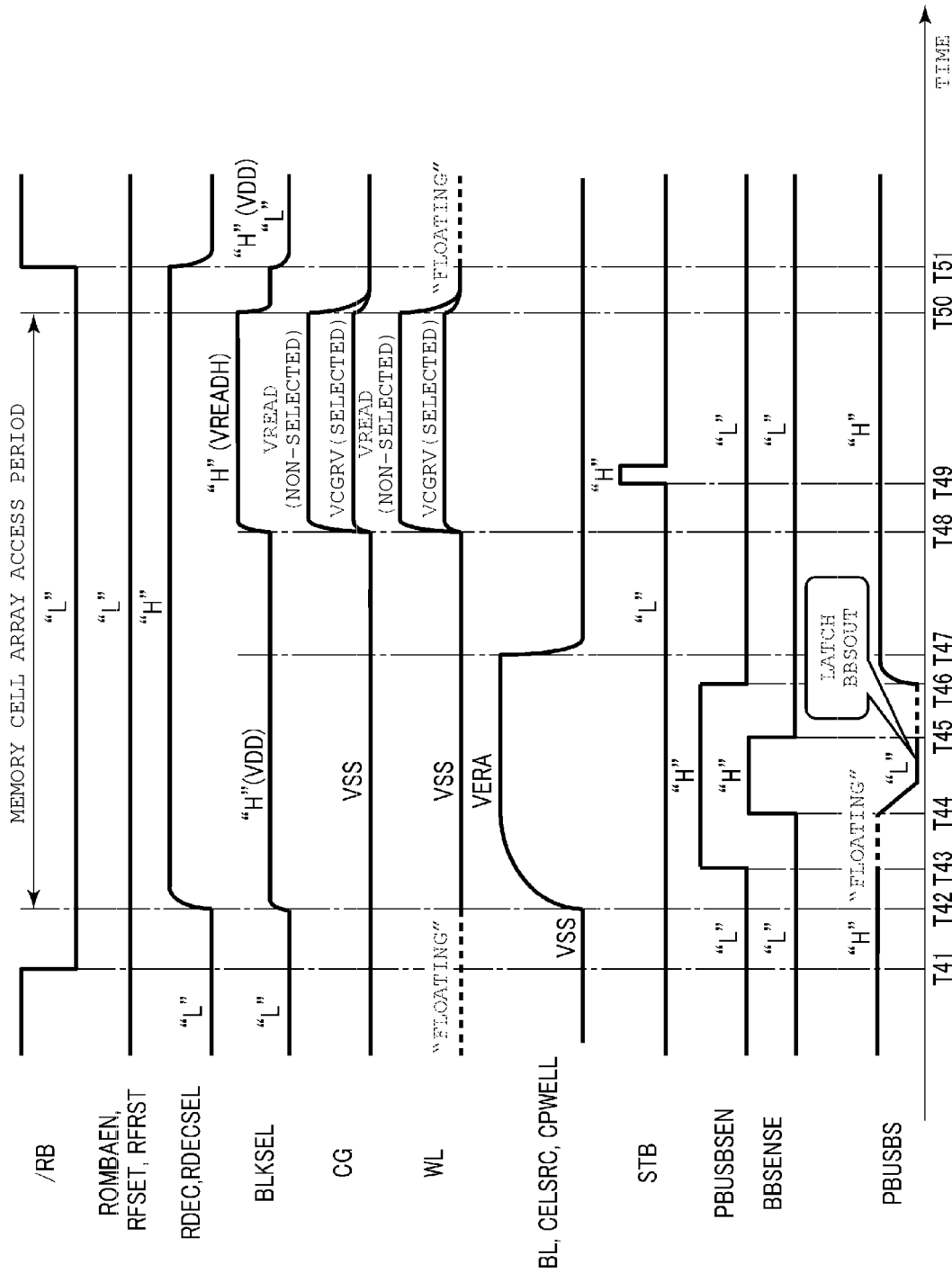
FIG. 17 is a timing chart for explaining a sensing operation of information set in a bad block latch of a semiconductor memory device according to a second modification example.
Figure 18:
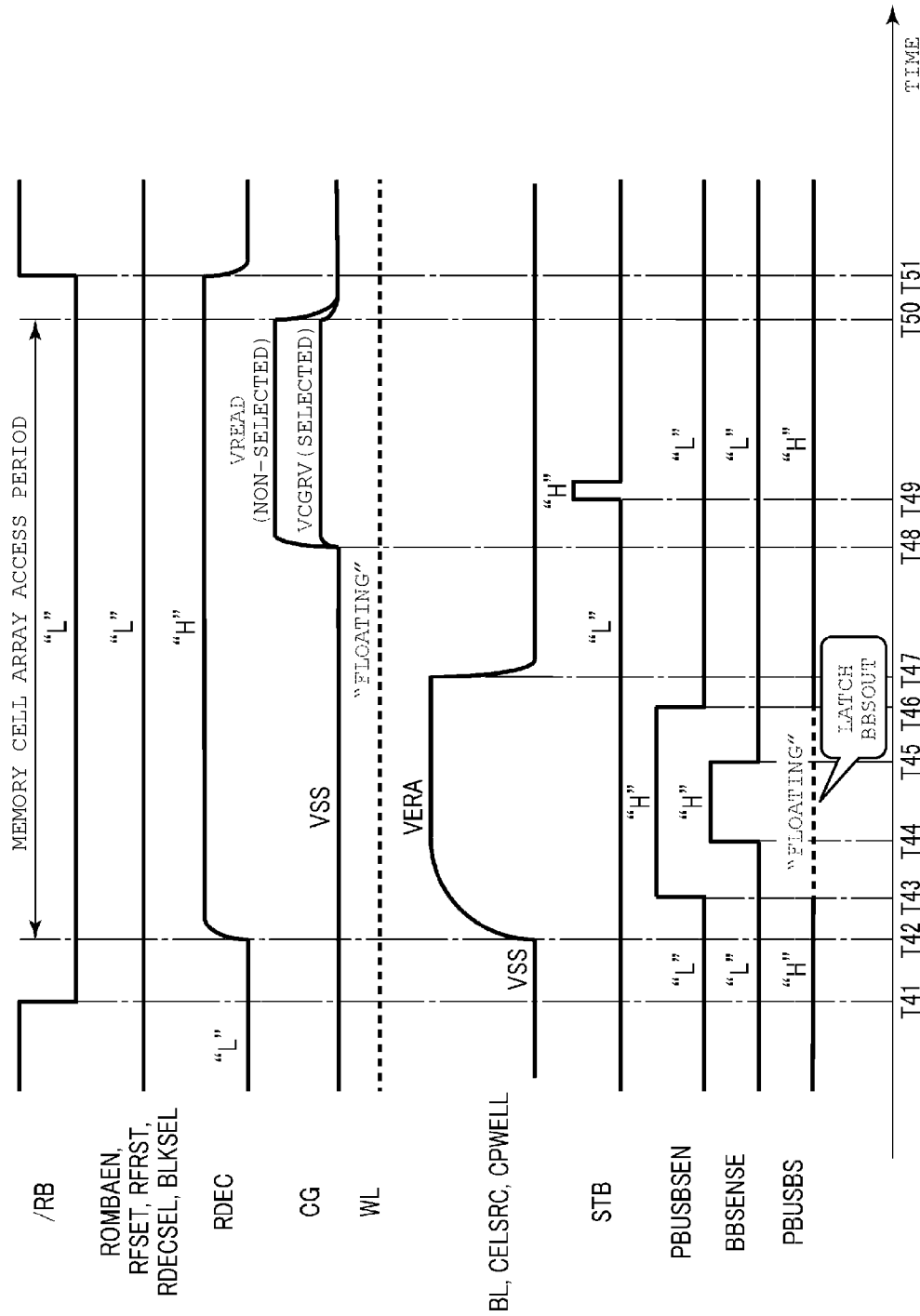
FIG. 18 is another timing chart for explaining the sensing operation of information set in the bad block latch of the semiconductor memory device according to the second modification example.

A case where the sensing operation of the bad block is executed within the memory cell array access period for the erasing operation will be described with reference to FIGS. 17 and 18. FIGS. 17 and 18 correspond to FIGS. 9 and 10, respectively, described in the first embodiment.

3.2.1 Sensing Operation in a Case Where Selected Block is Not Bad Block

The sensing operation of the bad block in a case where the selected block BLK is not a bad block will be described with reference to FIG. 17. That is, in the example of FIG. 17, the "H" level and the "L" level are set for nodes GD_A and BD_A in advance, respectively.

As illustrated in FIG. 17, up to time T41, the semiconductor memory device 20 receives a command from the controller 10 to execute the erasing operation. The erasing operation includes an erasing main operation and an erasing verification operation. In the example of FIG. 17, the erasing main operation corresponds to a period from time T42 to time T47, and the erasing verification operation corresponds to a period from time T48 to time T50.

At time T41, the logic control circuit 23 sets the signal /RB to the "L" level to inform the controller 10 that the semiconductor memory device 20 is in a busy state, and starts executing the erasing operation.

At the point in time T41, the nodes RDEC and ROMBAEN are set to the "L" level. Accordingly, the nodes RDECSEL and BLKSEL go to the "L" level. The wiring CG is at the voltage VSS. The transfer transistors TTr0 to TTr7 for transferring the voltage of the wiring CG to the word line WL, among the transfer transistors TTr in the transfer switch group 51, are turned OFF, so that the word line WL is in a floating state. Also, the nodes PBUSBSEN and BBSENSE are set to the "L" level. Accordingly, the node PBUSBS is set to the "H" level. The nodes RFSET and RFRST are set to the "L" level.

At time T42, the sequencer 25 sets the node RDEC to the "H" level and continues to keep the node ROMBAEN at the "L" level. With this, in the block decoder 52 of the selected block BLK, the transistors Tr1 and Tr12 are turned OFF and the transistors Tr6 to Tr11 are turned ON. Also, as described above, since the selected block BLK is not a bad block, the transistor Tr13 is in the ON state, and the "L" level is transferred to the node N2 via the node N1. Accordingly, the node RDECSEL goes to the "H" level and the "H" level is output to the node BLKSEL. Further, the transistors Tr16 and Tr17 are turned ON.

At time T42, the voltage applied to the selected block BLK from the driver set 27 is supplied, along with execution of as the erasing main operation. Specifically, the voltage VSS is supplied to the wiring CG and a voltage VERA is supplied to the bit line BL, the source line CELSRC, and the well line CPWELL.

The voltage VERA is a voltage for pulling out electrons injected into the charge storage layer 35 of the memory cell transistor MT, and is larger than the voltage VSS.

Here, in order to transfer the voltage VSS to the word line WL, the voltage VDDH is supplied to the gate of the transistor Tr3. With this, the voltage VDD is supplied to the level shifter LS via the node VBST, and the "H" level output to the node BLKSEL is boosted to the voltage VDD. With this, the voltage VSS transferred to the wiring CG is transferred to the word line WL via the transfer switch group 51. That is, time T42 is the start point in time of the memory cell array access period.

Since the operation from time T43 to time T46 is the same as the operation from time T3 to time T6 described in FIG. 9, the description thereof will be omitted.

At time T47, the driver set 27 supplies the voltage VSS to the wiring CG, the bit line BL, the source line CELSRC, and the well line CPWELL. By doing as described above, the erasing main operation is ended.

Since the operation from time T48 to time T50 is the same as the operation at and after time T28 described in FIG. 15, the description thereof will be omitted. That is, at time T50, the erasing verification operation is ended, and time T50 is the end point in time of the memory cell array access period. A value different from the voltage VCGRV in the read operation and the verification operation can be applied to the voltage VCGRV in the erasing verification operation.

At time T51, the logic control circuit 23 sets the signal /RB to the "H" level to inform the controller 10 that the semiconductor memory device 20 is in the ready state, and the execution of the erasing operation is ended.

By operating as described above, it is possible to sense information that the selected block BLK is not a bad block during the memory cell array access period for the erasing operation.

3.2.2 Sensing Operation in a Case Where Selected Block is a Bad Block

Next, the sensing operation of the bad block in a case where the selected block BLK is a bad block will be described d with reference to FIG. 18. That is, in the example of FIG. 18, the "L" level and the "H" level are set for nodes GD_A and BD_A in advance, respectively.

Times T41 to T51 in FIG. 18 correspond to times T41 to T51 described in FIG. 17.

As illustrated in FIG. 18, since the operation up to time T41 is the same as in the case of FIG. 17, the description thereof will be omitted.

At time T42, the sequencer 25 sets the node RDEC to the "H" level and continues to keep the node ROMBAEN at the "L" level. With this, in the block decoder 52 of the selected block BLK, the transistors Tr1 and Tr12 are turned OFF and the transistors Tr6 to Tr11 are turned ON. Also, as described above, since the selected block BLK is a bad block, the transistor Tr13 is in an OFF state. For that reason, the "H" level is transferred to the node N2 via the transistor Tr2. Accordingly, the nodes RDECSEL and BLKSEL continue to be at the "L" level. The transistors Tr16 and Tr17 are turned OFF.

At time T42, the voltage applied to the selected block BLK from the driver set 27 is supplied, along with execution of the erasing main operation. Specifically, the voltage VSS is supplied to the wiring CG, and the voltage VERA is supplied to the bit line BL, the source line CELSRC, and the well line CPWELL. That is, time T42 is the start point in time of the memory cell array access period. However, as described above, since the node BLKSEL is at the "L" level, the transfer switch group 51 remains in the OFF state.

Since the operation from time T43 to time T46 is the same as the operation from time T43 to time T46 described in FIG. 17, the description thereof will be omitted.

At time T47, the driver set 27 supplies the voltage VSS to the wiring CG, the bit line BL, the source line CELSRC, and the well line CPWELL. By doing as described above, the erasing main operation is ended.

At time T48, the sequencer 25 again sets the node RDEC to the "H" level and continues to keep the node ROMBAEN at the "L" level. However, as described above, since the selected block BLK is a bad block, the transistor Tr13 is in the OFF state. For that reason, the "H" level is transferred to the node N2 via the transistor Tr2. Accordingly, the nodes RDECSEL and BLKSEL continue to be at the "L" level.

At time T48, the voltages VCGRV and VREAD applied to the selected block BLK from the driver set 27 are transferred to the wiring CG, along with execution of the erasing verification operation. However, as described above, since the node BLKSEL is at the "L" level, the transfer switch group 51 remains in the OFF state, and the voltages VCGRV and VREAD are not transferred to the word line WL.

At time T49, the sequencer 25 sets the signal STB to the "H" level. However, as described above, since the node BLKSEL is at the "L" level, the transfer switch group 51 remains in the OFF state. For that reason, the voltages VCGRV and VREAD are not transferred to the word line WL, and data is not read from the memory cell transistor MT.

Since the operation at and after time T50 is the same as the operation described in FIG. 17, the description thereof will be omitted. That is, at time T50, the erasing verification operation ends and the memory cell array access period ends, and the execution of the erasing operation ends at time T51.

By operating as described above, it is possible to sense information that the selected block BLK is not a bad block during the memory cell array access period for the erasing operation.

Accordingly, even in a case where the bad block sensing operation is executed in the memory cell array access period for the erasing operation, the same effect as the effect described in the first embodiment can be exhibited.

In the example of FIGS. 17 and 18, the case where the sensing operation of data at time T49 is executed after the sensing operation of the bad block at times T43 to T46 is illustrated, but the present disclosure is not limited thereto. For example, the sensing operation of the bad block may be executed after the sensing operation of the data, or may be executed in parallel with the sensing operation of the data for a portion of or the entire period of the sensing operation of the bad block.

Also, in the examples of FIGS. 17 and 18, while the case where the bad block sensing operation is executed during the erasing main operation has been illustrated, the present disclosure is not limited thereto. For example, the sensing operation of the bad block may be performed during the verification operation.

3.3 Third Modification Example

In each of the embodiments and modification examples described above, while the case in which the sensing operation of the bad block is executed when the voltage VREAD is supplied to the wiring CG has been described, the present disclosure is not limited thereto. For example, the sensing operation of the bad block may be executed after the supply of the voltage VREAD or the like to the wiring CG is ended. Hereinafter, the configuration and operation similar to those of the second embodiment will be omitted, and the configuration and operation different from those of the second embodiment will mainly be described.

3.3.1 Sensing Operation in a Case Where Selected Block is Not a Bad Block

First, the sensing operation of the bad block in a case where the selected block BLK is not a bad block will be described with reference to FIG. 19. That is, in the example of FIG. 19, the "H" level and the "L" level are set for nodes GD_A and BD_A in advance, respectively.

Figure 19:
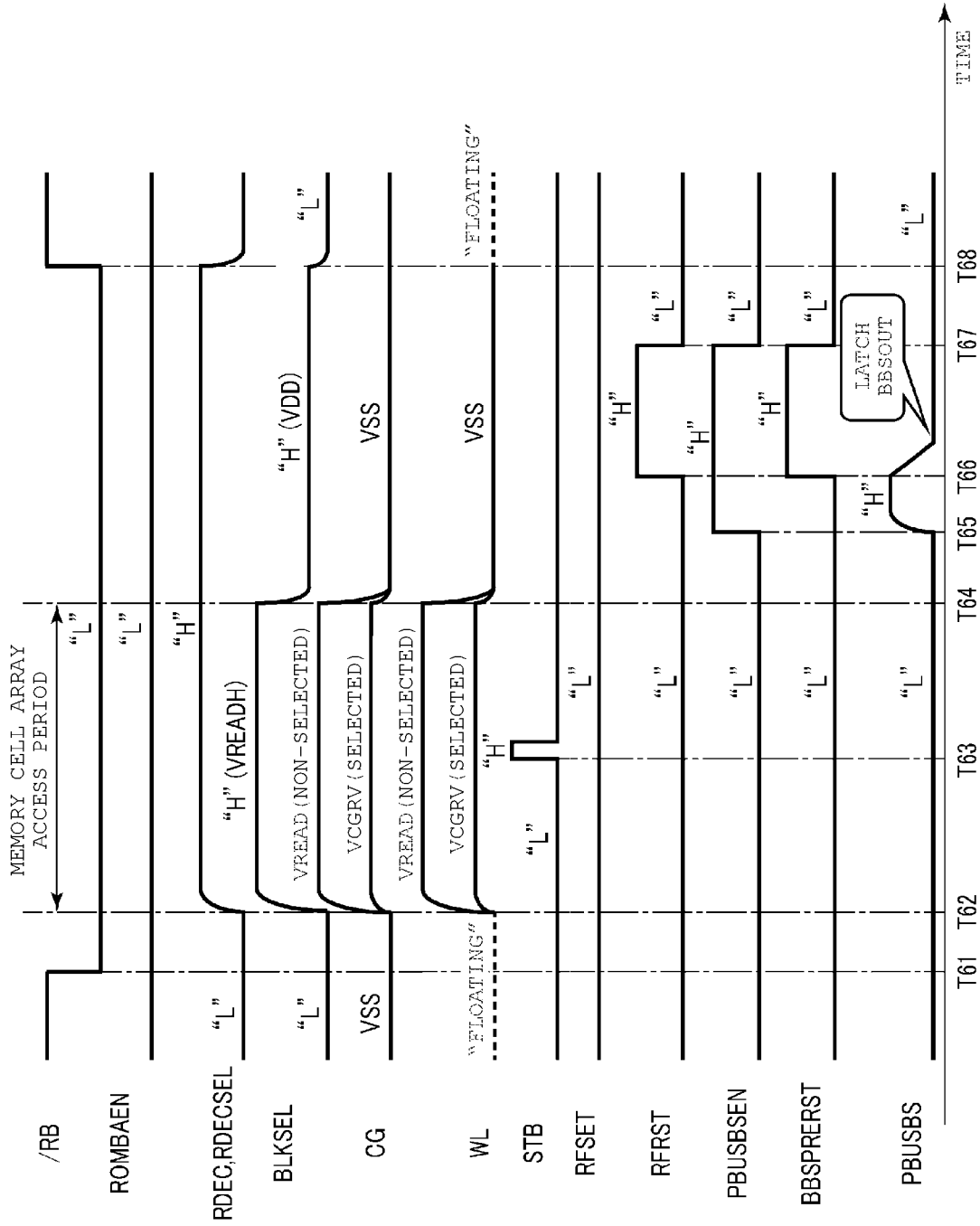
FIG. 19 is a timing chart for explaining a sensing operation of information set in a bad block latch of a semiconductor memory device according to a third modification example.

FIG. 19 corresponds to FIG. 13 described in the second embodiment.

As illustrated in FIG. 19, the same operations as those at times T11 and T12 described in FIG. 13 are executed at times T61 and T62, respectively. That is, at time T62, the voltage VREAD or the like is supplied to the wiring CG and the word line WL, and the memory cell array access period starts.

At time T63, the same operation as the operation at time T16 described in FIG. 13 is executed. That is, the sequencer 25 sets the signal STB to the "H" level. With this, the sense amplifier SA takes the state of the sense node of data into the internal latch circuit, and reads data from the memory cell transistor MT.

At time T64, the same operation as the operation at time T17 described in FIG. 13 is executed. That is, at time T64, the voltage VSS is supplied to the wiring CG and the word line WL, and the memory cell array access period ends.

At time T65 to time T67, the same operations as those at times T13 to T15 described in FIG. 13 are executed.

That is, at time T65, the node PBUSBSEN is pulled up to "H" level, in response to the node PBUSBS going to the "H" level.

At time T66, the nodes RFBST and BBSPRERST go to the "H" level, and the node PBUSBS is pulled down to the "L" level. The sequencer 25 latches the signal level of the node BBSOUT and senses information indicating that the selected block BLK is not a bad block.

At time T67, the nodes RSRST, PBUSBSEN, and BBSPRERST go to the "L" level.

At time T68, the same operation as the operation at time T18 described in FIG. 13 is executed. That is, at time T68, the node RDEC goes to the "L" level and the word line WL enters a floating state, and the read operation is ended.

By operating as described above, it is possible to sense information that the selected block BLK is not a bad block after the supply of the voltage VREAD to the wiring CG is completed.

3.3.2 Sensing Operation in a Case Where Selected Block is a Bad Block

Next, the sensing operation of the bad block in a case where the selected block BLK is a bad block will be described with reference to FIG. 20. That is, in the example of FIG. 20, the "L" level and the "H" level are set for the nodes GD_A and BD_A in advance, respectively.

FIG. 20 corresponds to FIG. 14 described in the second embodiment, and times T61 to T68 in FIG. 20 correspond to times T61 to T68 described in FIG. 19.

As illustrated in FIG. 20, at times 161 and T62, the same operations as the operations at times T11 and T12 described in FIG. 14 are executed, respectively. That is, at time T62, the voltage VREAD or the like is supplied to the wiring CG, and the memory cell array access period starts. The word line WL maintains the floating state.

At time T63, the same operation as the operation at time T16 described in FIG. 14 is executed. That is, the sequencer 25 sets the signal STB to the "H" level, but data is not read from the memory cell transistor MT.

At time T64, the same operation as the operation at time T17 described in FIG. 14 is executed. That is, at time T64, the voltage VSS is supplied to the wiring CG, and the memory cell array access period ends.

At time T65 to time T67, the same operations as those at times T13 to T15 described in FIG. 14 are executed.

That is, at time T65, the node PBUSBSEN is pulled up to the "H" level in response to the node PBUSBS going to the "H" level.

At time T66, the node RFRST goes to the "H" level, while the node BD and node PBUSBS are not connected. Also, in response to the node BBSPRERST going to the "H" level, the node PBUSBS changes from the "H" level to the floating state. The sequencer 25 latches the signal level of the node BBSOUT and senses information indicating that the selected block BLK is a bad block.

At time T67, the nodes RSRST, PBUSBSEN, and BBSPRERST go to the "L" level.

At time T68, the same operation as the operation at time T18 described in FIG. 14 is executed. That is, the node RDEC goes to the "L" level at time T68, and the read operation ends.

By operating as described above, it is possible to sense information that the selected block BLK is a bad block after the supply of the voltage VREAD to the wiring CG is ended.

As such, in the third modification example, the sensing operation of the bad block can be executed even during a period from time T64 to T68 after the transfer of the voltage VREAD to the word line WL is ended. As a supplementary explanation, the period from time T64 to T68 includes a period during which data is output to the controller 10 via the latch circuit XDL after reading of data from the memory cell transistor MT is ended, for example. For data output from the latch circuit XDL to the outside, a period longer than the time required for the sensing operation of the bad block is required. For that reason, as described in the third modification example, the period (time T65 to T67) required for the sensing operation of the bad block is performed in parallel with the period from time T64 to T68 and as a result, as compared with a case where the sensing operation is executed before time T62, the time required for the entire read operation can be shortened.

In the example of FIG. 19, while the voltage of the word line WL is promptly discharged to the voltage VSS at time T64, the present disclosure is not limited thereto. For example, the sequencer 25 may operate so as to maintain the voltage of the word line WL at a voltage higher than the voltage VSS until just before time T68. According to the third modification example, in a case where the selected block BLK is a bad block, the word line WL is maintained in a floating state. For that reason, even in the case where the discharge of the word line WL is not executed promptly as described above, it is possible to prohibit an unintentional current from flowing from the wiring CG to the word line WL with respect to the selected block BLK which is a bad block.

4. Others

In the first embodiment, the first modification example, and the second modification example, while the case where the transistor Tr18 is provided and the node BBSENSE is connected to the gate of the transistor Tr18 has been described, the present disclosure is not limited thereto. For example, the transistor Tr18 can be omitted, the node BBSENSE can be replaced by the node RDECSEL or omitted. In this case, the sensing operation of the bad block may be executed while the node PBUSBSEN is at the "H" level.

In the second embodiment and third modification example described above, while the case where one bad block latch 54 is provided in the block decoder 52 has been described, the present disclosure is not limited thereto. For example, one block decoder 52 may include a plurality of bad block latches 54 each of which corresponds to a different block BLK. In this case, the block decoder 52 is configured to hit all the blocks BLK corresponding to the plurality of bad block latches 54 based on the same block address information. Each of the transistors Tr13 of the plurality of bad block latches 54 provided in the same block decoder 52 has a first terminal connected in parallel to the node N1 and a second terminal connected in series with the first terminal of the transistor which is turned ON in a case where the corresponding block BLK is selected. With this, even in a case where one block decoder 52 includes a plurality of bad block latches 54, it is possible to selectively associate information of the bad block latch 54 corresponding to the selected block BLK with the node RDECSEL. Each of the transistor Tr16 of the plurality of bad block latches 54 provided in the same block decoder 52 includes the second terminal commonly connected to the node PBUSBS and the gate commonly connected to the node RDECSEL. With this, even in a case where one block decoder 52 includes the plurality of bad block latches 54, the signal level of the node PBUSBS can be controlled based on information of the bad block latch 54 corresponding to the selected block BLK. Accordingly, while the configuration of the block decoder 52 is shared by the plurality of blocks BLK, effects similar to those described in the second embodiment and the third modification example can be exhibited.

While a case where the first modification example and the second modification example described above are applied to the first embodiment, the present disclosure is not limited thereto, and the first modification example and the second modification example can also be similarly applied to the second embodiment.

While the case where the third modification example described above is applied to the second embodiment, the present disclosure is not limited thereto, and the third modification example can also be similarly applied to the first embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
    a memory cell array including:
        a first block including a first memory cell transistor, and
        a second block including a second memory cell transistor;
    a first word line connected to a gate of the first memory cell transistor;
    a second word line connected to a gate of the second memory cell transistor;
    a row decoder including:
        a first transfer transistor having a first terminal connected to the first word line,
        a first block decoder configured to supply a first block selection signal to a gate of the first transfer transistor,
        a second transfer transistor having a first terminal connected to the second word line, and
        a second block decoder configured to supply a second block selection signal to a gate of the second transfer transistor;
    a wiring connected to other end of the first transfer transistor and other end of the second transfer transistor;
    a voltage driver connected to the wiring; and
    a control unit,
    wherein each of the first block decoder and the second block decoder includes:
        a first transistor that includes a first terminal electrically connected to a first node and a second terminal to which a first voltage is supplied,
        a second transistor that includes a first terminal electrically connected to the first node and a second terminal to which the first voltage is supplied,
        an inverter that includes an input terminal electrically connected to the first node and an output terminal,
        a third transistor that includes a first terminal electrically connected to a sense node and a gate electrically connected to the output terminal of the inverter, and
        a latch circuit configured to store data and output a signal to switch the first transistor to an on state or an off state according to the stored data, and
    wherein, upon receipt of a command, the control unit performs an operation to cause the voltage driver to supply a second voltage higher than the first voltage to the wiring and cause the second transistor to be turned off, and thereafter determine the data stored in the latch circuit based on a voltage level of the sense node.

2. The semiconductor memory device according to claim 1,
    wherein each of the first block decoder and the second block further includes a level shifter including an input terminal electrically connected to the output terminal of the inverter and an output terminal electrically connected to the gate of a corresponding one of the first transfer transistor and the second transfer transistor.

3. The semiconductor memory device according to claim 1,
    wherein the operation includes one of a read operation, a write operation, and an erasing operation.

4. The semiconductor memory device according to claim 3,
    wherein, in the operation designated with one of the first block and a second block, the level shifter of a corresponding one of the first block decoder and a second block decoder outputs a third voltage larger than the second voltage when the latch circuit is set into a first logic level, and outputs the first voltage when the latch circuit is set into a second logic level which is an inverted logic of the first logic level.

5. The semiconductor memory device according to claim 4,
    wherein the control unit determines the data stored in the latch circuit based on the voltage level of the sense node after the voltage driver starts supplying the second voltage, and the control unit causes the voltage driver to stop supply of the second voltage when it is determined that the latch circuit is set into the second logic level.

6. The semiconductor memory device according to claim 1,
    wherein each of the first block decoder and the second block further includes:
        a fourth transistor that includes a first terminal to which a fourth voltage greater than the first voltage is supplied and a second terminal electrically connected to the input terminal of the inverter,
        a fifth transistor that includes a first terminal electrically connected to the first node and a gate to which the same signal as a signal input to a gate of the fourth transistor is input, the fifth transistor having a polarity different from that of the fourth transistor, and
    wherein, upon receipt of the command, the control unit further causes the fourth transistor to be turned off and causes the fifth transistor to be turned on.

7. The semiconductor memory device according to claim 6,
    wherein the latch circuit further includes a sixth transistor including a gate electrically connected to a second node, a first terminal electrically connectable to a third node electrically connected to a gate of the first transistor and a fourth node having a logic level inverted from a logic level of the third node, and a second terminal to which a fifth voltage smaller than the third voltage is supplied.

8. The semiconductor memory device according to claim 7, further comprising:
    a seventh transistor that includes a first terminal electrically connected to the sense node and a second terminal to which a sixth voltage is supplied,
    wherein the third transistor further includes a second terminal to which a seventh voltage smaller than the sixth voltage can be supplied through an eighth transistor, and
    wherein the control unit:
        determines that the latch circuit is set into a first logic level in a case where the eighth transistor is turned on and a voltage of the sense node is the sixth voltage, and determines that the latch circuit is not set into a second logic level which is an inverted logic of the first logic level in a case where the eighth transistor is turned on and the voltage of the sense node is the seventh voltage.

9. The semiconductor memory device according to claim 1,
wherein the third transistor further includes a second terminal electrically connectable to a third node electrically connected to a gate of the first transistor and a fourth node having a logic level inverted from a logic level of the third node.

10. The semiconductor memory device according to claim 9, further comprising:
a ninth transistor that includes a first terminal electrically connected to the sense node and a second terminal to which a sixth voltage is supplied; and
a tenth transistor including a first terminal electrically connected to the sense node and a second terminal to which a seventh voltage smaller than the sixth voltage is supplied,
wherein the control unit:
determines that the latch circuit is set into a first logic level in a case where a voltage of the sense node is the sixth voltage, and
determines that the latch circuit is not set into a second logic level which is an inverted logic of the first logic level in a case where the voltage of the sense node is the seventh voltage.

11. The semiconductor memory device according to claim 10, wherein the ninth transistor and the tenth transistor are opposite in polarity.

* * * * *